(12) United States Patent
Tange et al.

(10) Patent No.: US 7,672,031 B2
(45) Date of Patent: Mar. 2, 2010

(54) HOLOGRAM RECORDING MEDIUM, HOLOGRAM REPRODUCING APPARATUS, HOLOGRAM REPRODUCING METHOD, AND HOLOGRAM SHEET

(75) Inventors: Akira Tange, Kanagawa (JP); Tadashi Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 217 days.

(21) Appl. No.: 11/525,072

(22) Filed: Sep. 22, 2006

(65) Prior Publication Data

US 2007/0081211 A1    Apr. 12, 2007

(30) Foreign Application Priority Data

Oct. 6, 2005   (JP) .............................. 2005-293803
Sep. 12, 2006  (JP) .............................. 2006-247016

(51) Int. Cl.
  *G03H 1/28*  (2006.01)
  *G02B 5/32*  (2006.01)
(52) U.S. Cl. ............................ 359/22; 359/21; 365/125
(58) Field of Classification Search ...................... 359/2, 359/20, 21, 25
  See application file for complete search history.

(56) References Cited

U.S. PATENT DOCUMENTS

| 5,450,218 | A | * | 9/1995 | Heanue et al. | ................. 359/21 |
| 5,838,466 | A | * | 11/1998 | Mallik | ............................ 359/2 |
| 6,308,630 | B1 | * | 10/2001 | Kurokawa et al. | ........... 101/492 |
| 2003/0128324 | A1 | * | 7/2003 | Woods et al. | ................ 349/143 |
| 2005/0018263 | A1 | * | 1/2005 | Pharris | ......................... 359/22 |
| 2006/0262368 | A1 | * | 11/2006 | Teraoka | ........................ 359/25 |

* cited by examiner

*Primary Examiner*—Audrey Y Chang
(74) *Attorney, Agent, or Firm*—Oblon, Spivak, McClelland, Maier & Neustadt, L.L.P.

(57) ABSTRACT

A hologram recording medium includes a first element hologram and a second element hologram. On the first element hologram, main data is recorded such that the main data is converted into a two-dimensional image, object light of the two-dimensional image is interfered with recording reference light, and an interference fringe produced as a result of the interference is recorded on the first element hologram. On the second element hologram, simplified-form data representing the content of the main data using a smaller data size than the data size of the main data is recorded such that the simplified-form data is converted into a two-dimensional image, object light of the two-dimensional image is interfered with recording reference light, and an interference fringe produced as a result of the interference is recorded on the second element hologram.

19 Claims, 21 Drawing Sheets

FOURIER IMAGE

DP

DP

○ : hH
● : hL

HOLOGRAM RECORDING MEDIUM, HOLOGRAM REPRODUCING APPARATUS, HOLOGRAM REPRODUCING METHOD, AND HOLOGRAM SHEET

CROSS REFERENCES TO RELATED APPLICATIONS

The present invention contains subject matter related to Japanese Patent Application JP 2005-293803 filed in the Japanese Patent Office on Oct. 6, 2005 and Japanese Patent Application JP 2006-247016 filed in the Japanese Patent Office on Sep. 12, 2006, the entire contents of which are incorporated herein by reference.

BACKGROUND OF THE INVENTION

1. Field of the Invention

The present invention relates to a hologram recording medium on which data is recorded in the form of a hologram, an apparatus for reproducing data from a hologram recording medium, and a method of reproducing data from a hologram recording medium.

2. Description of the Related Art

It is known to record information on a sheet-shaped recording medium such that the information is recorded in the form of a one-dimensional code or a two-dimensional code such as a bar code, a QR code, or a dot code (see, for example, Japanese Unexamined Patent Application Publication No. 2005-173646). However, this type of information recording medium is very low in storage capacity per unit area. For example, the typical storage capacity is in the range from several ten bytes to several kilo bytes. This very low storage capacity is simply because of its physical limitation on the resolution of printing a black-and-white pattern.

It is also known to use a hologram recording medium as a sheet-shaped recording medium that allows various kinds of data to be recorded in the form of an interference fringe produced as a result of interference between object light and reference light. It is known that the hologram recording medium has a very large storage density and thus the hologram recording medium is very large in storage capacity. For example, the hologram recording medium is expected to be very advantageously usable as a high-capacity storage medium for storing computer data or content data such as audio data or video data.

In the hologram recording medium, data is recorded in the form of an image of two-dimensional page data. When the image of the data is displayed on a liquid crystal display panel or the like, if light is passed through this liquid crystal display panel, object light of the image is obtained. The resultant object light of the image of the two-dimensional page data is focused on the hologram recording medium. In this state, the hologram recording medium is illuminated with a reference light such that the reference light falls on the hologram recording medium at a predetermined angle. As a result, interference occurs between the object light and the reference light, and an interference fringe is produced. The resultant interference fringe pattern is recorded as one element hologram in the form of a dot or a strip. That is, one page of two-dimensional page data is recorded as one element hologram.

SUMMARY OF THE INVENTION

For example, a hologram memory may be produced in the form of a sheet, and data such as computer data or audio visual content data may be recorded on the hologram memory. A user is allowed to acquire the data recorded on this hologram memory by using a reproducing apparatus.

The sheet-shaped hologram memory refers to a hologram memory that allows data to be recorded on an array of a large number of element holograms on a surface of a medium. The data recorded on the array of element holograms can be read by using a hologram reader placed so as to face the surface of the medium.

In this system, it is desirable to achieve high usability in the operation of reading data using the hologram reader, and it is also desirable to achieve a capability of efficiently reading information in a different manner depending on a need for a user.

The need for information varies depending on the content of the information and depending on users. For example, in the case of audio content data, some users may want to acquire audio data in a high-quality form. The same audio data may not be very important for some other users, and high-quality audio data is not needed for them in this case.

Thus, it is desirable that information can be read in an optimum manner depending on a desire of a user, a situation, content of information, and/or other factors. In view of the above, the present invention provides a hologram recording medium, a hologram reproducing apparatus, and a reproduction method, which allow it to efficiently read information in an optimum manner depending on a requirement for a user.

More specifically, the present invention provides a hologram recording medium adapted to record data thereon such that the data is converted into a two-dimensional image, object light of the two-dimensional image is interfered with recording reference light, and an interference fringe produced as a result of the interference is recorded as an element hologram on the hologram recording medium, the hologram recording medium including a first element hologram on which main data is recorded and a second element hologram on which simplified-form data representing the content of the main data with a data size smaller than the data size of the main data is recorded.

In this hologram recording medium, the simplified-form data may be data with lower data quality than the data quality of the main data.

For example, in the case of audio data or video data, the simplified-form data may be data produced from the main data so as to be low in sound quality or image quality by using a different quantization bit length or a different sampling frequency from that of the main data or produced by compressing original data at a high compression ratio than the compression ratio of the main data.

In the case of moving or still video data, the simplified-form data may be data produced by reducing the number of pixels per frame of original data by means of a pixel skipping technique or the like so as to become low in resolution (the number of pixels per frame) than the resolution of the main data. In the case in which moving video data is recorded as the main data, the simplified-form data may be data produced from the main data by properly skipping frames, or may be data of a collection of still images extracted from the main data which can be played back in the form of a slide show.

In the case of audio data, the simplified-form data may be data produced by cutting a particular frequency band of original audio data. For example, a high frequency band and a low frequency band may be cut, and a remaining middle frequency band of the original audio data may be used as the simplified-form data.

In the case of a computer program or application data, the simplified-form data may be a program with limited functions, that is, a program capable of executing only particular functions of all functions provided by a program recorded as the main data.

In the hologram recording medium, the simplified-form data may be data compressed at a higher compression ratio than a compression ratio of the main data.

For example, when the main data is uncompressed data, the simplified-form data may be data produced by compressing the main data. In the case in which the main data is compressed data, the simplified-form data may be data produced by compressing original data at a higher compression ratio than the compression ratio of the main data. That is, regardless of the data quality of the main data, the simplified-form data may be produced by performing compression so as to be lower in compression ratio than the main data, thereby obtaining simplified-form data which represents the content of the main data by using a less data size than the data size of the main data.

In the hologram recording medium, the simplified-form data may be data obtained by extracting a part of the main data.

For example, in the case of audio data, the simplified-form data may be a part of music data recorded as the main data. More specifically, the simplified-form data may be an introduction part or a climax part extracted from the music data recorded as the main data.

In a case in which moving video data is recorded as the main data, the simplified-form data may be simplified moving video data produced by extracting a small number of frames of the main data or may be one or more still images extracted from the main data.

In a case of a computer program or application data, the simplified-form data may be a simplified program capable of executing only particular functions of all functions provided by a program recorded as the main data.

In a case of text data, the simplified-form data may be text extracted from the full text data recorded as the main data or may be a summary thereof.

In the hologram recording medium, the first element hologram and the second element hologram are recorded using recording reference light with the same incident angle.

Alternatively, the first element hologram may be recorded using recording reference light falling thereon at a first angle, and the second element hologram may be recorded using recording reference light falling thereon at a second angle. That is, the first and second element holograms may be formed in the angle multiplexed manner.

The present invention also provides a hologram reproducing apparatus adapted to reproduce data from a hologram recording medium, including imaging means for taking an image by illuminating the hologram recording medium with reproduction reference light and taking a two-dimensional image which appears as reproduced-image light from the element hologram as a result of the illumination of the hologram recording medium with reproduction reference light, and signal processing means for performing signal processing on the two-dimensional image obtained by the imaging means to decode the data recorded as the element hologram, and producing main data and simplified-form data from the decoded data.

In the hologram reproducing apparatus, the signal processing means may store decoded data acquired from respective element holograms into the storage means, and, after as much decoded data as sufficient to reproduce the simplified-form data has been collected in the storage means, the signal processing means may reproduce the simplified-form data by reconstructing the decoded data collected in the storage means.

The hologram reproducing apparatus may further include notification means for, when as much decoded data as sufficient to reproduce the simplified-form data has been collected in the storage means, notifying that it has become ready to reproduce the simplified-form data by reconstructing the decoded data.

In the hologram reproducing apparatus, the signal processing means may store decoded data acquired from respective element holograms into the storage means, and, when as much decoded data as sufficient to reproduce the main data has been collected in the storage means, the signal processing means may reproduce only the main data by reconstructing the decoded data collected in the storage means.

In the hologram reproducing apparatus, the imaging means may be adapted to perform a first operation and a second operation, the first operation including illuminating the hologram recording medium with reproduction reference light with a first illumination angle and taking a two-dimensional image of an element hologram recorded using recording reference light with the first illumination angle, the second operation including illuminating the hologram recording medium with reproduction reference light with a second illumination angle and taking a two-dimensional image of an element hologram recorded using recording reference light with the second illumination angle.

The present invention also provides a method of reproducing data from a hologram recording medium, including the steps of taking an image by illuminating the hologram recording medium with reproduction reference light and taking a two-dimensional image which appears as reproduced-image light from the element hologram as a result of the illumination of the hologram recording medium with reproduction reference light, performing signal processing on the two-dimensional image obtained in the image taking step to decode the data recorded as the element hologram, and producing main data and simplified-form data from the decoded data.

As described above, the hologram reproducing apparatus acquires decoded data by reading a two-dimensional image from an element hologram on a hologram recording medium and decoding the read two-dimensional image. This process is performed for each of a large number of element holograms, and decoded data obtained from the large number of element holograms are collected. The content data or the like recorded on the hologram recording medium is then reproduced by reconstructing the collected decoded data.

Because reading of information from the hologram recording medium is performed in the above-described manner, it is needed to read data from all or almost all element holograms to obtain data from which to reproduce the original content data or the like. However, this takes a rather long time. When the content of the information to be read is not very important to a user, it is not desirable to take a long time to scan the hologram recording medium. To avoid the above problem, simplified-form data is recorded on the hologram recording medium in addition to the main data. The simplified-form data is smaller in data size than the main data and can be read in a shorter time than needed to read the main data.

The present invention also provides a hologram sheet including a first hologram recording area in which data is recorded such that the data is divided into blocks each having a predetermined data size, each data block is converted into an image, object light of the image is interfered with recording reference light, and an interference fringe produces as a result of the interference is recorded as an element hologram, and a second hologram recording area in which information which is a part of the data recorded in the first hologram recording area is recorded such that the data of the information is divided into blocks each having a predetermined data size, each data block of the information is converted into an image, object light of the image is interfered with recording reference light, and an interference fringe produces as a result of the interference is recorded as an element hologram, wherein the hologram sheet is partially masked such that only the second hologram recording area is exposed.

DESCRIPTION OF THE PREFERRED EMBODIMENT

The present invention is described in further detail below with reference to specific embodiments in conjunction with the accompanying drawings. The explanation will be given in terms of items listed below.

1. Recording and Reproducing of Data on or from Hologram Memory
2. Arrangement of First and Second Element Holograms on Hologram Memory
3. Configuration of Hologram Reader
4. First Example of Reproduction Process
5. Second Example of Reproduction Process
6. Advantages of Embodiments and Examples of Modifications to Embodiments 1. Recording and Reproducing of Data on or from Hologram Memory First, a basic process of recording and reproducing data on or from a hologram memory 3 is described with reference to FIG. 1.

Figure 1A:
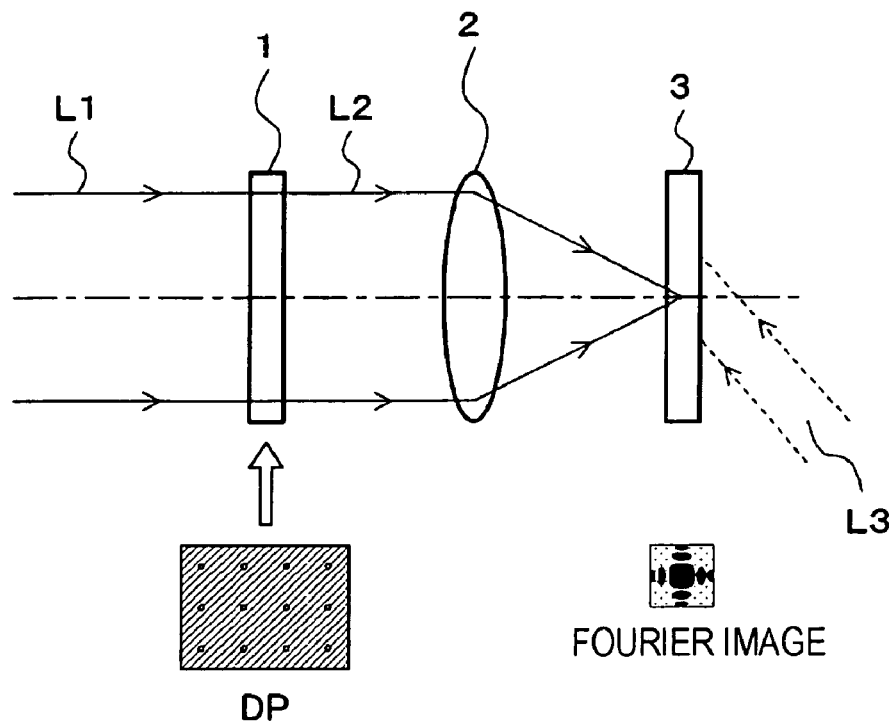
FIG. 1A is a schematic diagram showing a manner in which data is recorded on a hologram memory according to an embodiment of the present invention.

FIG. 1A shows a manner in which data is recorded on the hologram memory 3. For example, when data such as content data or a computer program is recorded in the hologram memory 3, the data is encoded into a form of one or more pages of data.

More specifically, for example, the total content data is divided into a plurality of data blocks each having a predetermined data size, and encoding is performed on a block-by-block basis.

Each encoded data block is converted into a two-dimensional image DP and displayed on a liquid crystal panel 1 as shown in FIG. 1A.

A laser light beam L1 emitted from a light source is collimated, and is passed through the liquid crystal panel 1 on which the two-dimensional image DP is displayed. As a result, object light L2 of the two-dimensional image DP emerges from the liquid crystal panel 1.

The object light L2 is focused by a focusing lens 2 onto a spot of the hologram memory 3.

The hologram memory 3 is also illuminated with recording reference light L3 falling thereon at a particular angle such that the reference light L3 interfered with the object light L2. As a result, an interference pattern of dots is created and is recorded as an element hologram.

In the case in which the focusing lens 2 is used in the above-described manner, the object light L2 is converted by the focusing lens 2 into a Fourier image, and thus the data recorded as the element hologram is given in the form of the Fourier image.

Each element hologram is recorded on the hologram memory 3 in the above-described manner. That is, encoded data blocks are converted one by one into a two-dimensional image DP, which is displayed on the liquid crystal panel 1 and recorded as an element hologram.

Figure 2:
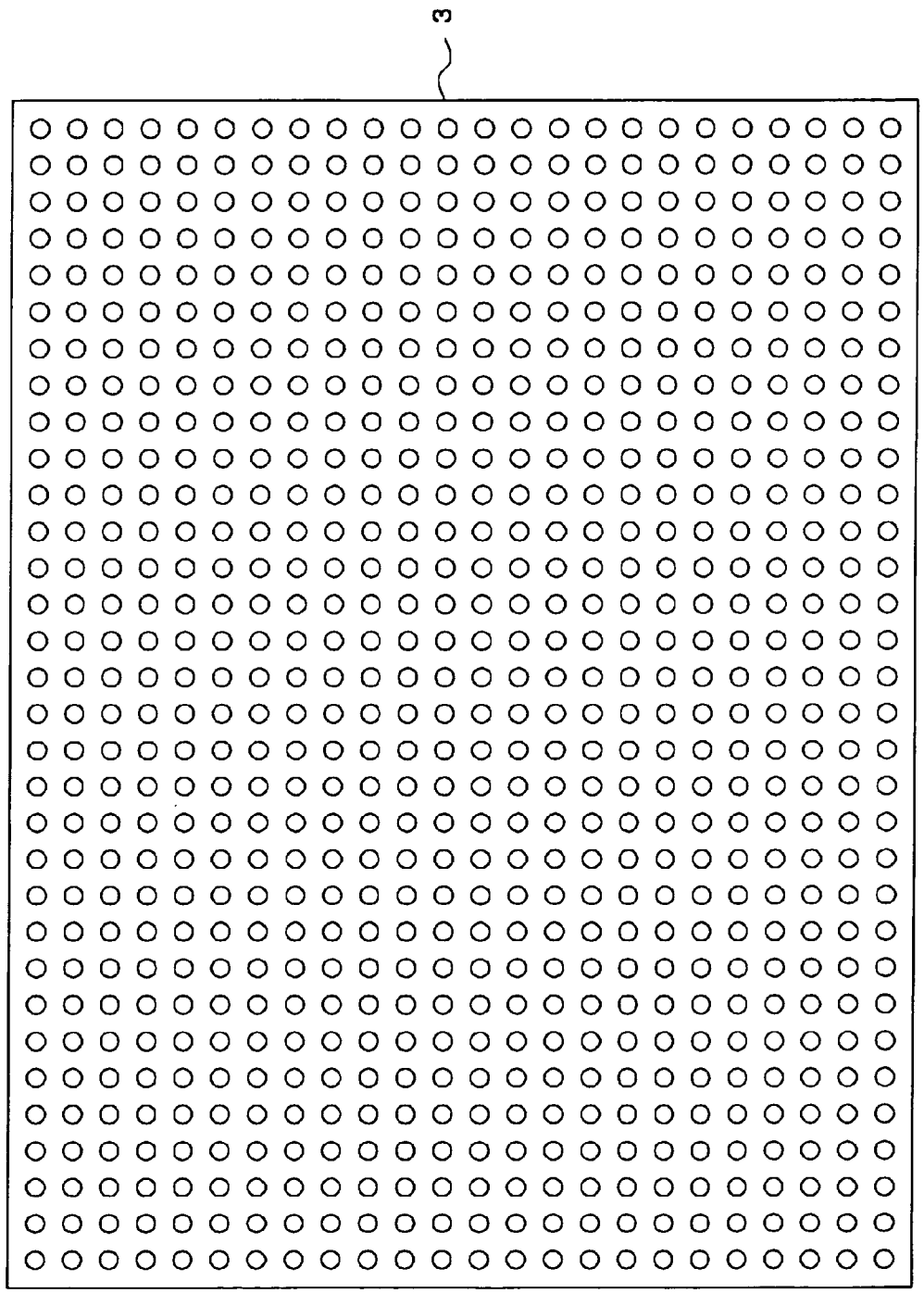
FIG. 2 is a schematic diagram showing element holograms on a hologram memory according to an embodiment of the present invention.

When the element holograms are recorded, the recording position on the hologram memory 3 on which the element hologram is recorded is slightly shifted in a plane on the hologram memory 3 by moving the hologram memory 3 (hologram material) using a moving mechanism (not shown) or by moving a recording optical system. As a result, a plurality of element holograms are recorded at two-dimensional array positions in the plane on the sheet-shape hologram memory 3. FIG. 2 shows an example of a manner in which a plurality of element holograms are formed in a plane. In the example shown in FIG. 2, each element hologram is represented by an open circle.

Figure 3:
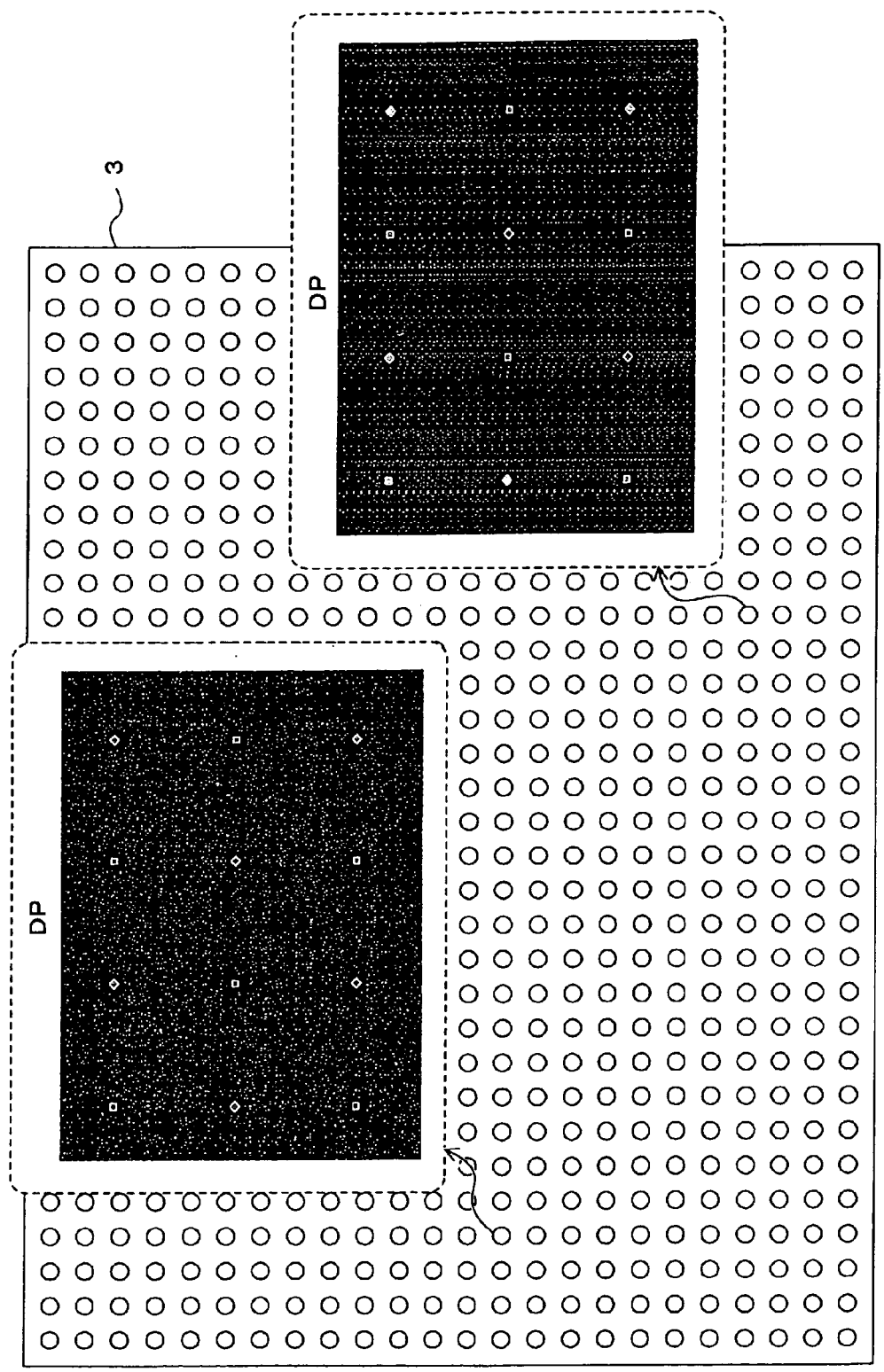
FIG. 3 is a schematic diagram showing two-dimensional images of element holograms according to an embodiment of the present invention.

In the specific example shown in FIG. 2, 32 element holograms is arranged in a horizontal direction and 24 element holograms are arranged in a vertical direction in the plane of the hologram memory 3. In each element hologram, as shown in FIG. 3, a two-dimensional image DP including, for example, 512×384 pixels is recorded.

Figure 1B:
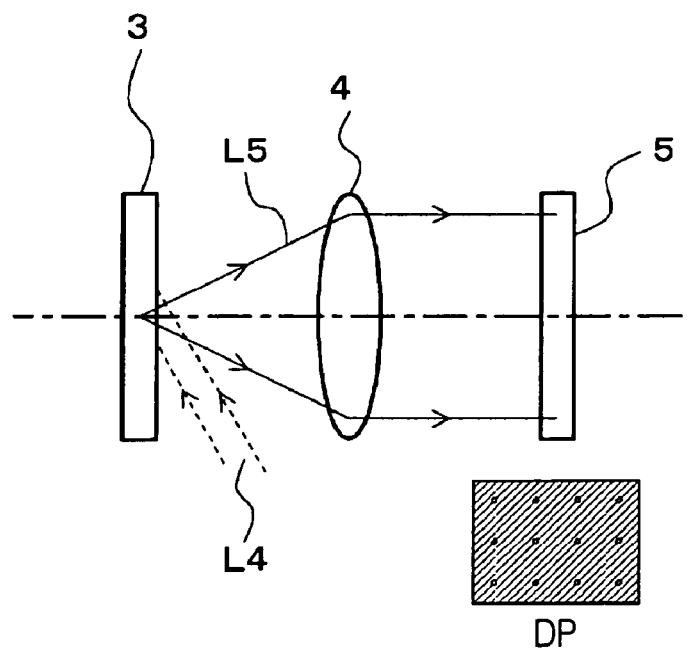
FIG. 1B is a schematic diagram showing a manner in which data is reproduced from a hologram memory according to an embodiment of the present invention.

FIG. 1B shows a manner in which a hologram including a plurality of element holograms recorded on the hologram memory 3 is reproduced. A collimator lens 4 and an imager 5 shown in FIG. 1B are included in a hologram reader serving as a reproducing apparatus.

The hologram memory 3 is illuminated with reproduction reference light L4 falling thereon at the same angle as in the recording process. As a result of the illumination of the reproduction reference light L4, a reproduced image of an element hologram recorded on the hologram memory 3 is obtained. That is, an image of two-dimensional page data appears at a position conjugate to the liquid crystal panel 1 used in the recording process, and this image is read by the imager 5.

More specifically, reproduced-image light L5 from the hologram memory 3 is collimated by the collimator lens 4 and incident on the imager 5 constructed, for example, using a CCD image sensor array or a CMOS image sensor array. Note that the Fourier image on the hologram memory 3 is subjected to an inverse Fourier transform when the light L5 from the hologram memory 3 is passed through the collimator lens 4 and an image of a two-dimensional page data is reproduced as a result. This reproduced two-dimensional image DP is read by the imager 5.

The imager 5 generates an image signal in the form of an electrical signal corresponding to the reproduced image. By decoding this image signal, the original data in the form in which the data was not yet converted into the two-dimensional page data for recording is obtained in the original form.

By sequentially reading the data for all element holograms on the hologram memory 3, the original content data is reproduced.

The basic process of recording and reproducing data on or from the hologram memory 3 has been described above. In the hologram recording/reproducing technique described above, if element holograms are recorded in an angle-multiplexed manner, the storage capacity can be greatly increased.

Figure 4A:
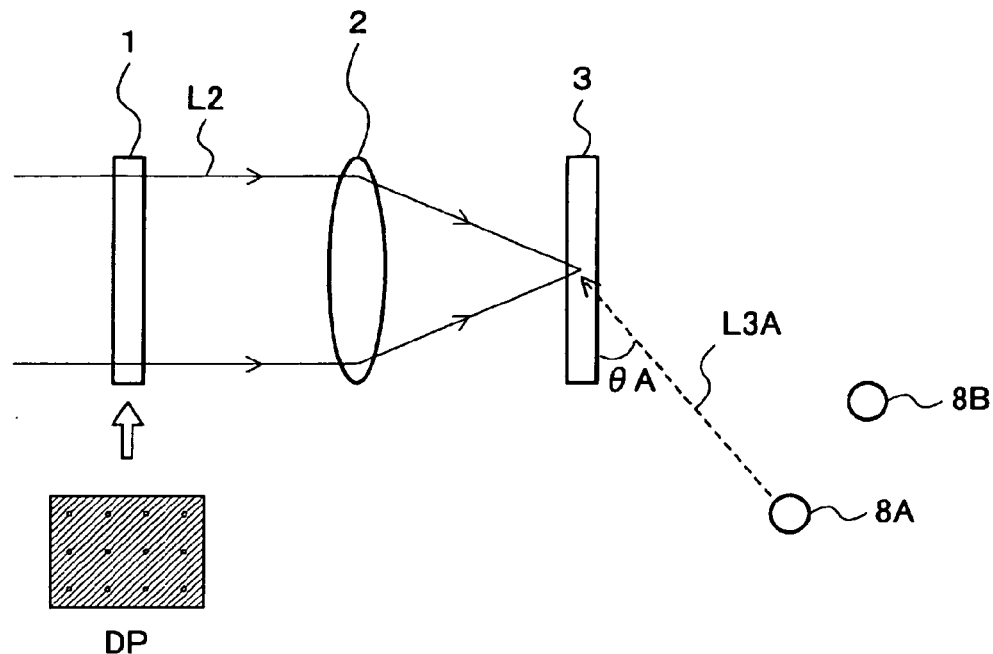
FIG. 4A is a schematic diagram showing a manner in which, in angle-multiplexed recording, data is recorded on a hologram memory by using recording light falling on the hologram memory at a first angle according to an embodiment of the present invention.
Figure 4B:
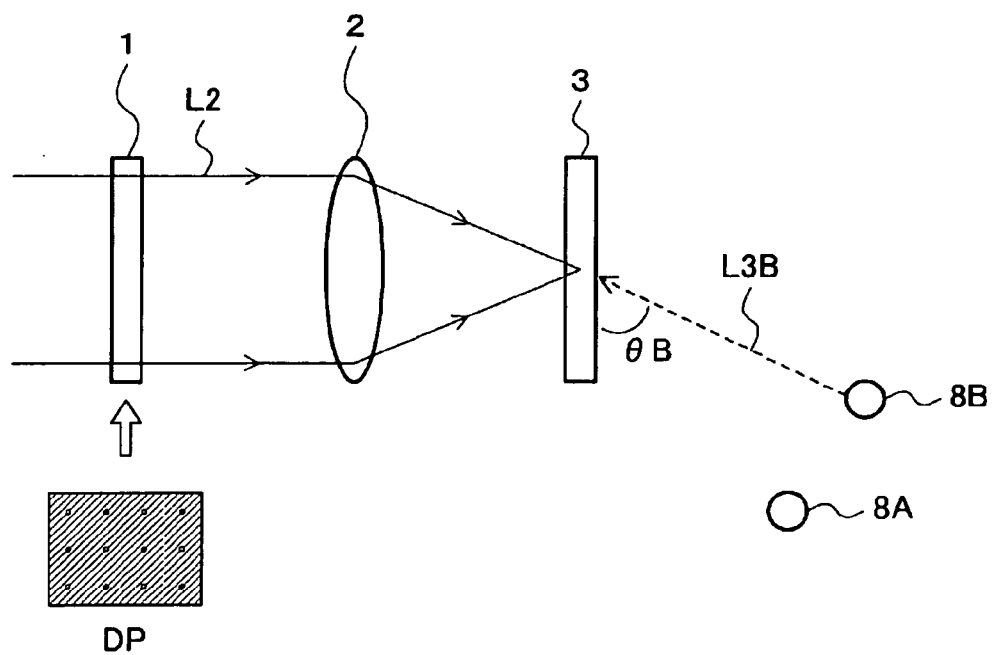
FIG. 4B is a schematic diagram showing a manner in which, in angle-multiplexed recording, data is recorded on a hologram memory by using recording light falling on the hologram memory at a second angle according to an embodiment of the present invention.

FIGS. 4A and 4B show a manner in which recording is performed using the angle multiplexing technique. As shown in FIGS. 4A and 4B, the hologram memory 3 is illuminated with recording reference light at a different incident angle θA or θB depending on whether the hologram memory 3 is illuminated with recording reference light L3A emitted from a light source position 8A or with recording reference light L3B emitted from a light source position 8B. Note that it is not necessarily needed to dispose separate light sources at respective light source positions 8A and 8B from which to emit reference light toward the hologram memory 3. For example, the light source position may be switched between 8A and 8B by switching the optical path of light emitted from a single light source.

In the angle multiplexing technique, first, as shown in FIG. 4A, a two-dimensional image DP of data to be recorded is displayed on the liquid crystal display 1. Object light L2 of the two-dimensional image DP emerging from the liquid crystal panel 1 is focused by the focusing lens 2 onto a spot on the hologram memory 3. In a period during which the object light L2 is focused on the spot on the hologram memory 3, the hologram memory 3 is also illuminated with the recording reference light L3A falling at an angle θA from the light source position 8A. An interference fringe pattern is created by interference between the recording reference light L3A and the object light L2, and is recorded as an element hologram.

In a different period, as shown in FIG. 4B, a two-dimensional image DP of data to be recorded is displayed on the liquid crystal display 1. Object light L2 of the two-dimensional image DP emerging from the liquid crystal panel 1 is focused by the focusing lens 2 onto a spot on the hologram memory 3. In this period, the hologram memory 3 is also illuminated with the recording reference light L3B falling at an angle θB from the light source position 8B. An interference fringe pattern is created by interference between the recording reference light L3B and the object light L2, and is recorded as an element hologram.

Figure 5:
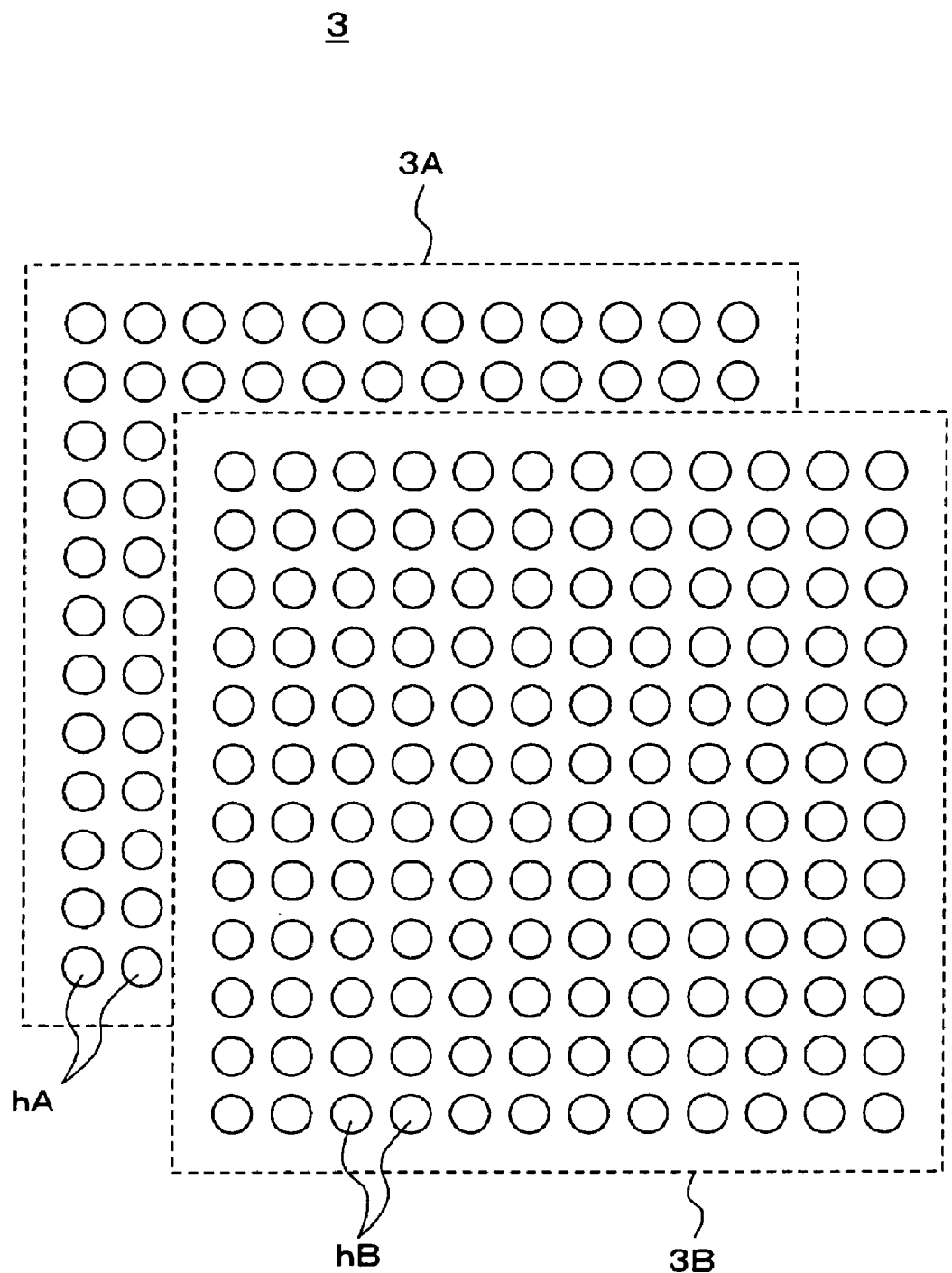
FIG. 5 is a schematic diagram showing a recording plane formed on a hologram memory in angle-multiplexed recording according to an embodiment of the present invention.

As a result of the recording processes shown in FIGS. 4A and 4B, an array of element holograms hA formed by using the recording reference light L3A is produced in a first plane 3A on the hologram memory 3, and an array of element holograms hB formed by using the recording reference light L3B is produced in a second plane 3B as shown in FIG. 5. That is, in the angle multiplexing recording on the hologram memory 3, element holograms are formed in a plurality of two-dimensional planes. Herein, the term "plane" is used although the first plane 3A and the second plane 3B are not actually in a form of physically separated planes.

Reproducing of data from the hologram memory 3 on which element holograms hA and hB are recorded can be performed as follows.

Figure 6A:
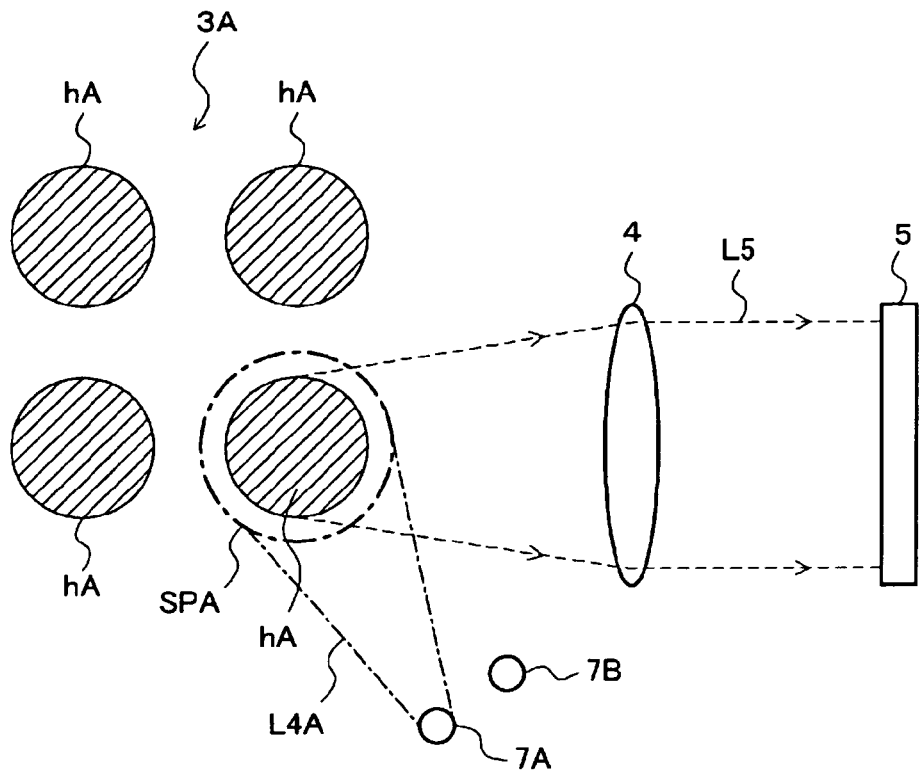
FIG. 6A is a schematic diagram showing a manner in which, in reproduction of angle-multiplexed data, data is reproduced by using reference light falling on the hologram memory at a first angle according to an embodiment of the present invention.

FIG. 6A shows a manner in which element holograms hA formed in the first plane 3A of the hologram memory 3 are read.

Figure 6B:
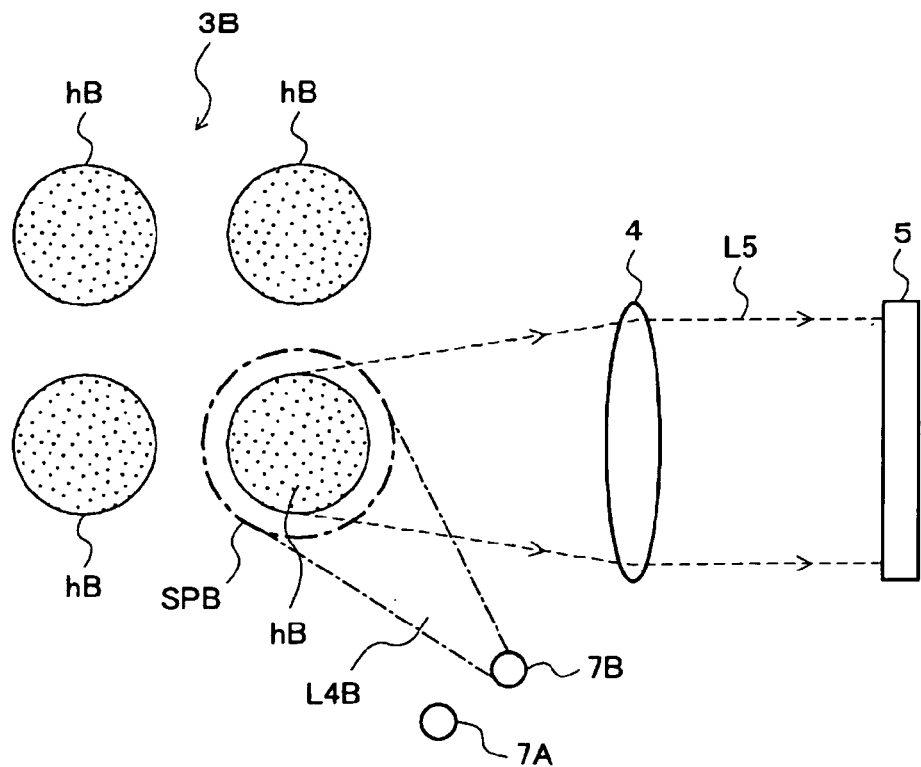
FIG. 6B is a schematic diagram showing a manner in which, in reproduction of angle-multiplexed data, data is reproduced by using reference light falling on the hologram memory at a second angle according to an embodiment of the present invention.

Reference light sources 7A and 7B shown in FIGS. 6A and 6B are light sources disposed in a reproducing apparatus (hologram reader 6 described later).

The reference light source 7A is disposed such that reproduction reference light L4A emitted from the reference light source 7A falls on the hologram memory 3 at the same angle θA as the angle at which the recording reference light from the light source position 8A falls in the recording process. Similarly, the reference light source 7B is disposed such that reproduction reference light L4B emitted from the reference light source 7B falls on the hologram memory 3 at the same angle θB as the angle at which the recording reference light from the light source position 8B falls in the recording process.

To read the element holograms hA in the first plane 3A, the reference light source 7A is turned on to illuminate an element hologram hA by a spot SPA of the reproduction reference light L4A as shown in FIG. 6A. Although element holograms hB in the second plane 3B are formed at the same positions of the element holograms hA, the illumination by the reproduction reference light L4A causes only reproduced-image light L5 of the element hologram hA to be obtained, and this reproduced-image light L5 is detected by the imager 5.

To read the element holograms hB in the second plane 3B, the reference light source 7B is turned on to illuminate an element hologram hB by a spot SPB of the reproduction reference light L4B as shown in FIG. 6B. In this case, reproduced-image light of the element hologram hA is not obtained, but only reproduced-image light L5 of the element hologram hB is obtained and detected by the imager 5.

The process of recording and reproducing data on or from the hologram memory 3 using the angle muliplexing technique has been described above. It is possible to produce, by contact copying, a large number of copies of such a hologram memory 3 on which data is recorded as element holograms.

The hologram memory 3 produced by recording element holograms on a hologram material as shown in FIG. 1A may be directly supplied to a user or may be used as a master medium by which to produce a large number of copies of the hologram memory by means of contact copying.

For example, computer data, audio visual data, or the like may be recorded on a hologram recording medium, a large number of copies thereof may be produced, and they may be distributed among a large number of users so that users are allowed to acquire the data recorded on the hologram memory 3 by reading the data using a reproducing apparatus (the hologram reader 6). In such a system, it is preferable that a hologram master medium be produced as shown in FIG. 1A, and a large number of copies thereof be produced and distributed among users. It is preferable that a user read data by performing the operation shown in FIG. 1B.

The hologram reader 6, which will be described in detail later, scans the hologram memory 3 to read element holograms one by one by illuminating the hologram memory 3 by the reproduction reference light L4. The scanning may be performed in a manual mode by a user or in an automatic mode by a mechanism of the hologram reader 6.

Figure 7A:
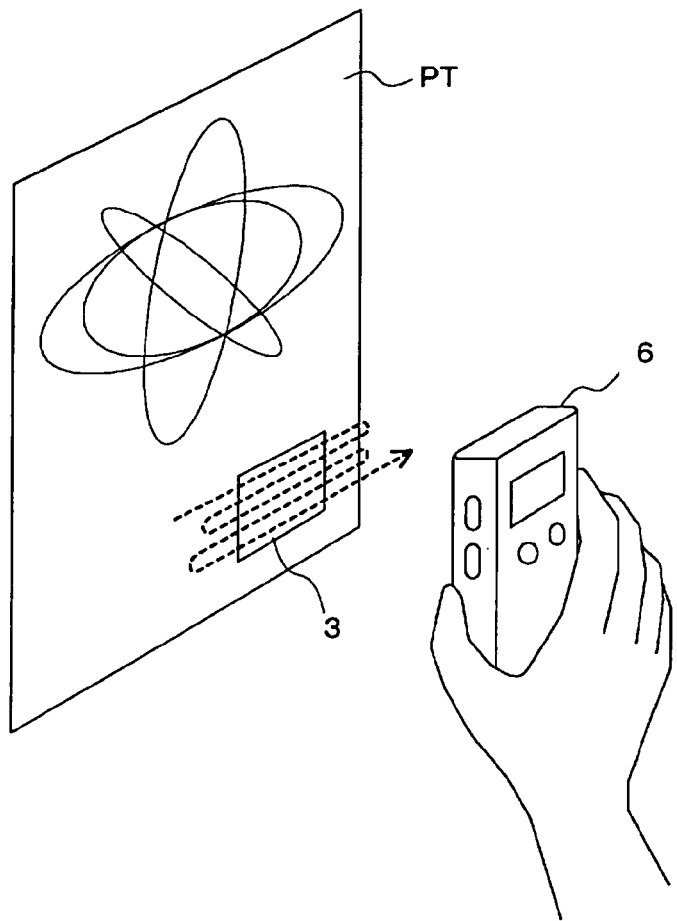
FIG. 7A is a schematic diagram showing an example of an operation of manually scanning a hologram reader according to an embodiment of the present invention.
Figure 7B:
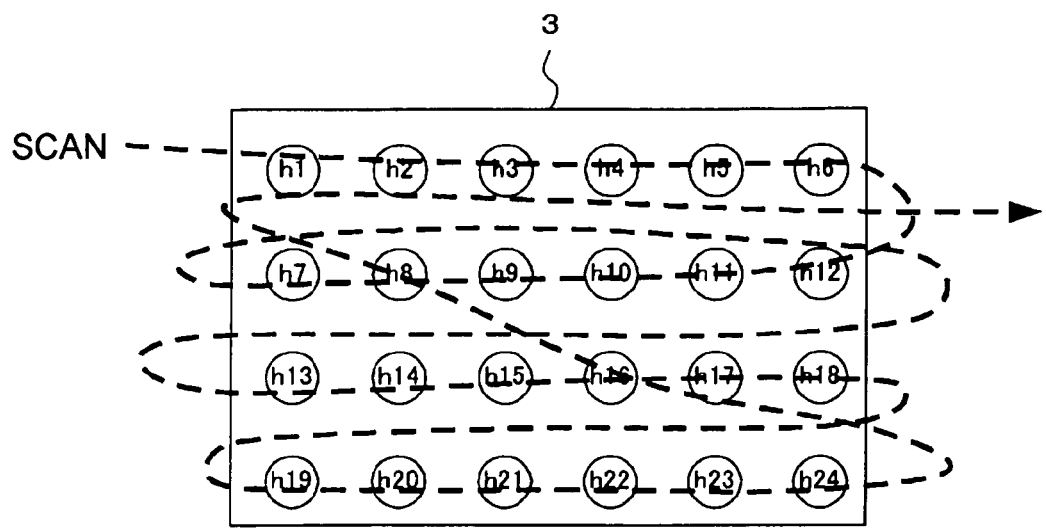
FIG. 7B is a schematic diagram showing an example of an operation of manually scanning a hologram reader according to an embodiment of the present invention.

FIGS. 7A and 7B show a specific example of a manual scanning operation. In the example shown in FIG. 7A, a hologram memory 3 on which data such as audio content data is recorded is stuck on a poster PT. The hologram reader 6 is constructed in a form small in shape and light in weight so that a user can handle it with his/her hand. On one surface of a case of the hologram reader 6, a light source for outputting reproduction reference light L4 and a lens system for capturing reproduced-image light coming from the hologram memory 3 are disposed.

As shown in FIG. 7A, a user holds the hologram reader 6 in his/her hand, brings it to a position close to the hologram memory 3 such that one surface of the case of the hologram reader 6 faces the hologram memory 3, and shakes the hologram memory 3 in arbitrary directions. When the hologram memory 3 is shaken in such a manner, the reproduction reference light L4 strikes the element holograms at a particular angle while scanning the element holograms, and reproduced images of the element holograms are read by the hologram reader 6.

Figure 8:
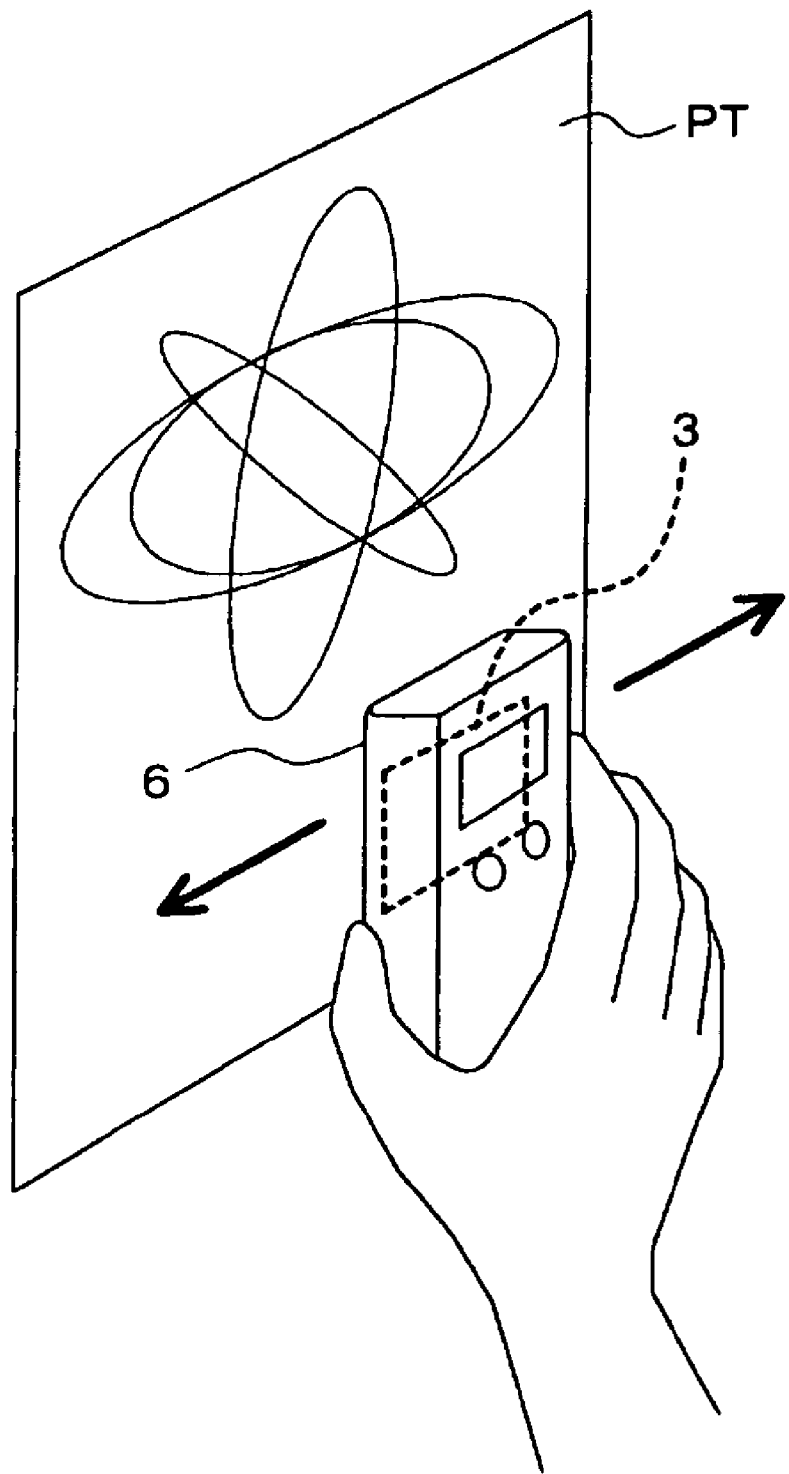
FIG. 8 is a schematic diagram showing an example of an operation of manually scanning a hologram reader according to an embodiment of the present invention.

Instead of shaking the hologram reader 6 to right and left while maintaining the hologram reader 6 apart from the hologram memory 3 as shown in FIG. 7A, the hologram reader 6 may be shaken to right and left while moving it in a vertical direction in a state in which a part of the case of the hologram reader 6 is kept in contact with the surface of the hologram memory 3, that is, the hologram reader 6 may be slid across the surface of the hologram memory 3 as shown in FIG. 8.

FIG. 7B schematically shows the hologram memory 3 on which a large number of element holograms h1 to h24 are recorded. In a reading operation, a user arbitrarily shakes the hologram reader 6 to right and left. As a result, the hologram memory 3 is scanned along a path such as that represented by a broken line in FIG. 7B (a spot of the reproduction reference light L4 moves along this path).

The path along which the user will move the hologram reader 6 is absolutely unpredictable. That is, the spot of the reproduction reference light L4 moves along an unpredictable path, and the element holograms on the hologram memory 3 are illuminated with the reproduction reference light L4 in random order. During the scanning operation, a reproduced image of an element hologram illuminated by the spot of the reproduction reference light L4 is read by the hologram reader 6 in random order. That is, element holograms h1 to h24 are read randomly. In the hologram reader 6, data read from element holograms are decoded and stored in the order in which element holograms are scanned. When as much decoded data as necessary to reproduce the original data has been collected, the original data is reproduced by reconstructing the collected data.

In the automatic scanning, the hologram reader 6 operates such that an internal scanning mechanism moves the illumination position of the reproduction reference light L4 or moves a unit that holds the collimator lens 4 and the imager 5 so that element holograms on the hologram memory 3 are sequentially scanned. For example, scanning is performed automatically in a state in which the hologram reader 6 is placed so as to face the hologram memory 3 stuck on a poster or the like as shown in FIG. 8. In this case, what is needed for a user to do is to simply hold the hologram reader 6 in front of the hologram memory 3, because the scanning mechanism automatically scans the element holograms on the hologram memory 3 by moving the illumination position of the reproduction reference light L4 or the lens system.

For example, the hologram memory 3 may be produced in the form of a sheet and may be stuck on a substrate in the form of a card, and the hologram reader 6 may be configured such that the card on which the sheet-shaped hologram memory 3 is stuck can be inserted into the hologram reader 6. When the card of the hologram memory 3 is inserted in the hologram reader 6, the element holograms on the hologram memory 3 may be automatically scanned.

2. Arrangement of First and Second Element Holograms on Hologram Memory

As described above, data is recorded on the hologram memory 3 such that data to be recorded is converted into a two-dimensional image, object light L2 of this two-dimensional image is interfered with the recording reference light L3 so as to create an interference fringe pattern, and the resultant interference fringe pattern is recorded as an element hologram.

According to an embodiment of the present invention, the hologram memory 3 includes a first element hologram on which main data is recorded and a second element hologram on which simplified-form data representing the content of the main data with a data size smaller than the data size of the main data is recorded.

To reproduce content recorded as main data on a large number of element holograms as shown in FIG. 2, it is required to read substantially all element holograms and connect the data read from the respective element holograms in a correct order. However, it takes a rather long time to reproduce the content in such a manner. In particular, a long time is needed when the scanning is performed manually.

All content data are not necessarily important for all users. For example, a user may want to listen to music content for a short time just for evaluation or the like. In such a case, the content data does not necessarily need to have high quality. It is advantageous to record such data in the simplified form according to the present embodiment of the invention. The simplified-form data may be small in data size and low in data quality compared with the main data. For example, music data may be recorded in the simplified form so that a user is allowed to listen to the music data in a short time for evaluation before deciding whether to purchase it. The simplified-form data is useful in particular for such a purpose, because the small data size thereof makes it possible to quickly read the data.

Referring to FIGS. 9A to 9J, first and second element holograms, on which main data and simplified-form data are recorded, are explained.

Figure 9:
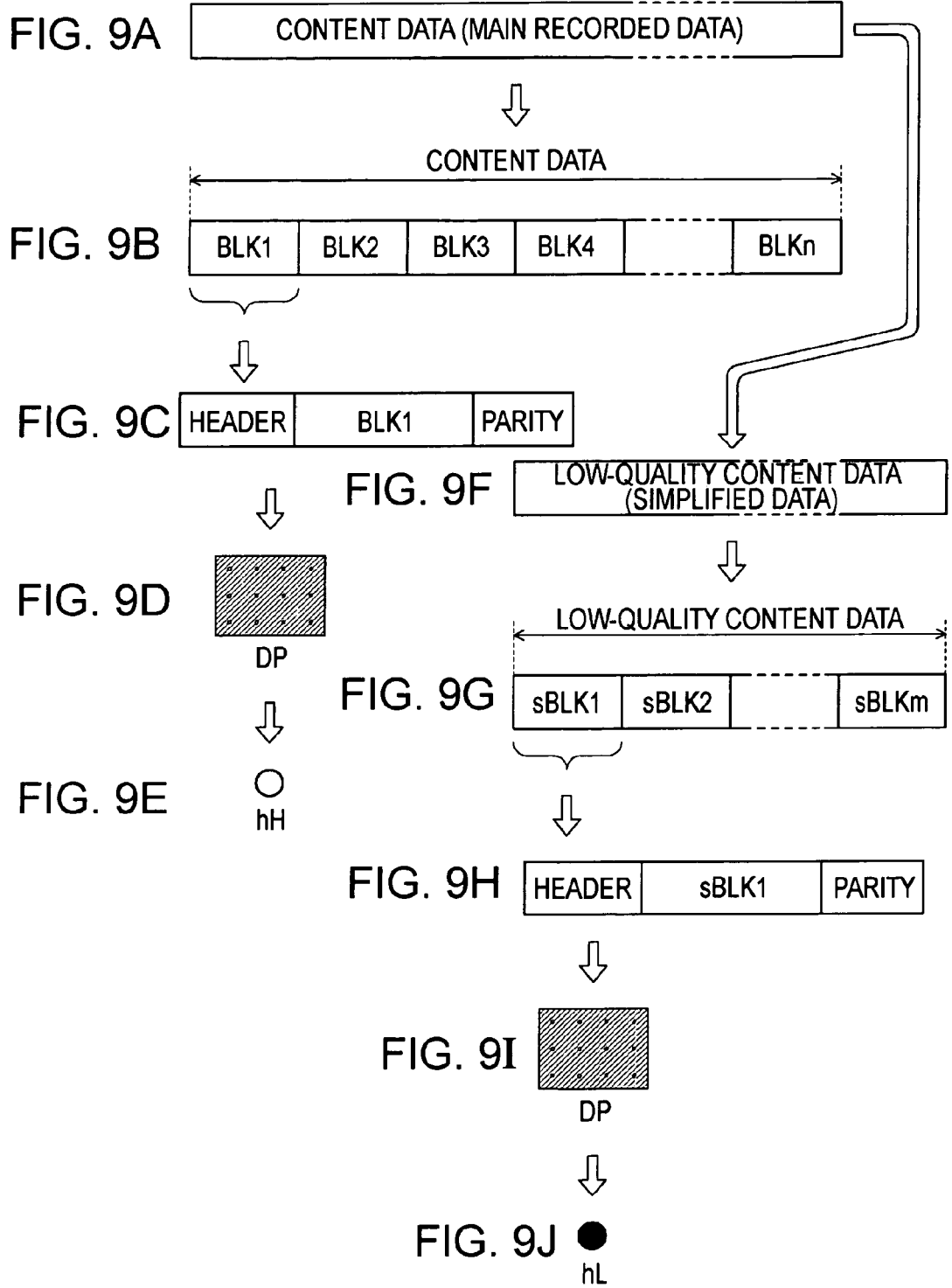
FIG. 9A is a diagram showing content data which is to be recorded as main data on first element holograms according to an embodiment of the present invention.
FIG. 9B is a diagram showing content data in a state in which original content data has been divided into blocks, which are to be recorded as main data on first element holograms according to an embodiment of the present invention.
FIG. 9C is a diagram showing one of blocks of content data to be recorded as main data on first element holograms, the one of blocks being in a state in which additional data is attached to the block, according to an embodiment of the present invention.
FIG. 9D is a diagram showing one of blocks of content data to be recorded as main data on first element holograms, the one of blocks being in a state in which the data has been converted into a two-dimensional image, according to an embodiment of the present invention.
FIG. 9E is a diagram showing an element hologram on which a two-dimensional image of one of blocks of content data is recorded as hologram data, according to an embodiment of the present invention.
FIG. 9F is a diagram showing simplified-form data produced from content data, the simplified-form data being to be recorded on second element holograms, according to an embodiment of the present invention.
FIG. 9G is a diagram showing simplified-form data in a state in which original simplified-form data has been divided into blocks, which are to be recorded on second element holograms according to an embodiment of the present invention.
FIG. 9H is a diagram showing one of blocks of simplified-form data to be recorded on second element holograms, the one of blocks being in a state in which additional data is attached to the block, according to an embodiment of the present invention.
FIG. 9I is a diagram showing one of blocks of simplified-form data to be recorded on second element holograms, the one of blocks being in a state in which the data has been converted into a two-dimensional image, according to an embodiment of the present invention.
FIG. 9J is a diagram showing an element hologram on which a two-dimensional image of one of blocks of simplified-form data is recorded as hologram data, according to an embodiment of the present invention.

FIG. 9A shows content data to be recorded as main data on the hologram memory 3. The content data may be, for example, audio content data such as music data.

To record this content data on the hologram memory 3, the whole content data is converted into a plurality of two-dimensional images and recorded as a plurality of element holograms.

More specifically, for example, as shown in FIG. 9B, the entirety of the content data is divided into data blocks (BLK1, BLK2, . . . BLKn) with a predetermined size and encoded on a block-by-block basis.

In the encoding process, for example, as shown in FIG. 9C, header information and parity data for error correction are added to each block data, and each block with header information and parity data is recorded as an element hologram. The header information includes, for example, address information such as a data block number, an attribute of the content data, a file type, the total size of the content data, the size of one data block, and the number of blocks included in the content data.

Each block data such as that shown in FIG. 9C is converted into a two-dimensional image DP such as that shown in FIG. 9D. The resultant two-dimensional image DP is recorded as a first element hologram hH as shown in FIG. 9E.

Meanwhile, from the content data shown in FIG. 9A, a low-quality content data such as shown in FIG. 9F is produced, for example, by compressing the content data at a high compression ratio. A specific example of a low-quality content data is audio content data compressed at a high compression ratio. Such high-compression audio data is very small in data size compared with the content data shown in FIG. 9A, although a sound reproduced from the high-compression audio data becomes worse in sound quality than the sound quality achieved by the content data shown in FIG. 9A.

In the present embodiment, the low-quality content data is also recorded on the hologram memory 3. As for the low-quality content data, the entirety of the low-quality content data is converted into one or a small number of two-dimensional images and recorded as one or a corresponding small number of element holograms.

More specifically, first, for example, as shown in FIG. 9G, the entirety of the low-quality content data is divided into data blocks (sBLK1, sBLK2, . . . , sBLKm) and encoded on a block-by-block basis.

In the encoding process, for example, as shown in FIG. 9H, header information and parity data for error correction are added to each block data, and each block with header information and parity data is recorded as an element hologram. The header information includes, for example, address information such as a data block number, an attribute of the data, a file type, the total size of the low-quality content data (in the simplified form), the size of one data block, and the number of blocks included in the low-quality content data (in the simplified form).

The header information further includes quality classification information to discriminate between the simplified-form data and the content data. The quality classification information may be a flag indicating whether the data is content data or simplified-form data. Alternatively, the address information may be classified according to a predetermined rule so that the resultant class of the address information indicates whether the data is content data or simplified-form data.

Each block data such as that shown in FIG. 9H is converted into a two-dimensional image DP such as that shown in FIG. 9I. The resultant two-dimensional image DP is recorded as a second element hologram hL as shown in FIG. 9J.

The first element holograms hH and the second element holograms hL formed in a plane of the hologram memory 3 such as that shown in FIG. 2 may be arranged in various manners. Some examples are shown in FIG. 10 to 13. In these figures, first element holograms hH are represented by open circles, and second element holograms hL are represented by solid circles.

Figure 10:
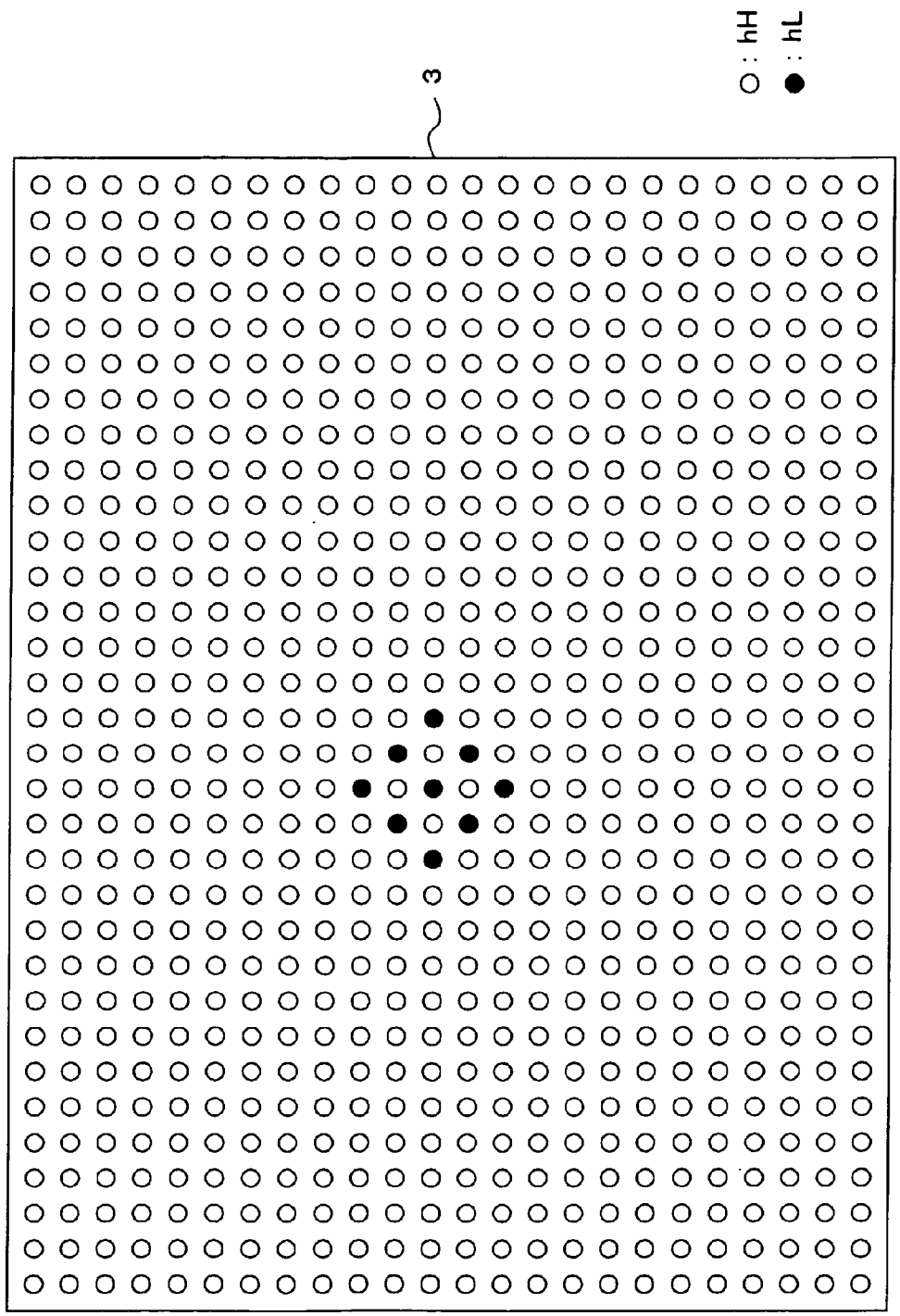
FIG. 10 is a schematic diagram showing an example of arrangement of first and second element holograms according to an embodiment of the present invention.

In an example shown in FIG. 10, a plurality of second element holograms hL, on which simplified-form data such as low-quality content data is recorded, are disposed in a central area in a plane on the hologram memory 3.

The second element holograms hL are disposed in the central area because element holograms in the central area are highly likely to be read in an early stage of a manual scanning operation performed by a user.

Figure 11:
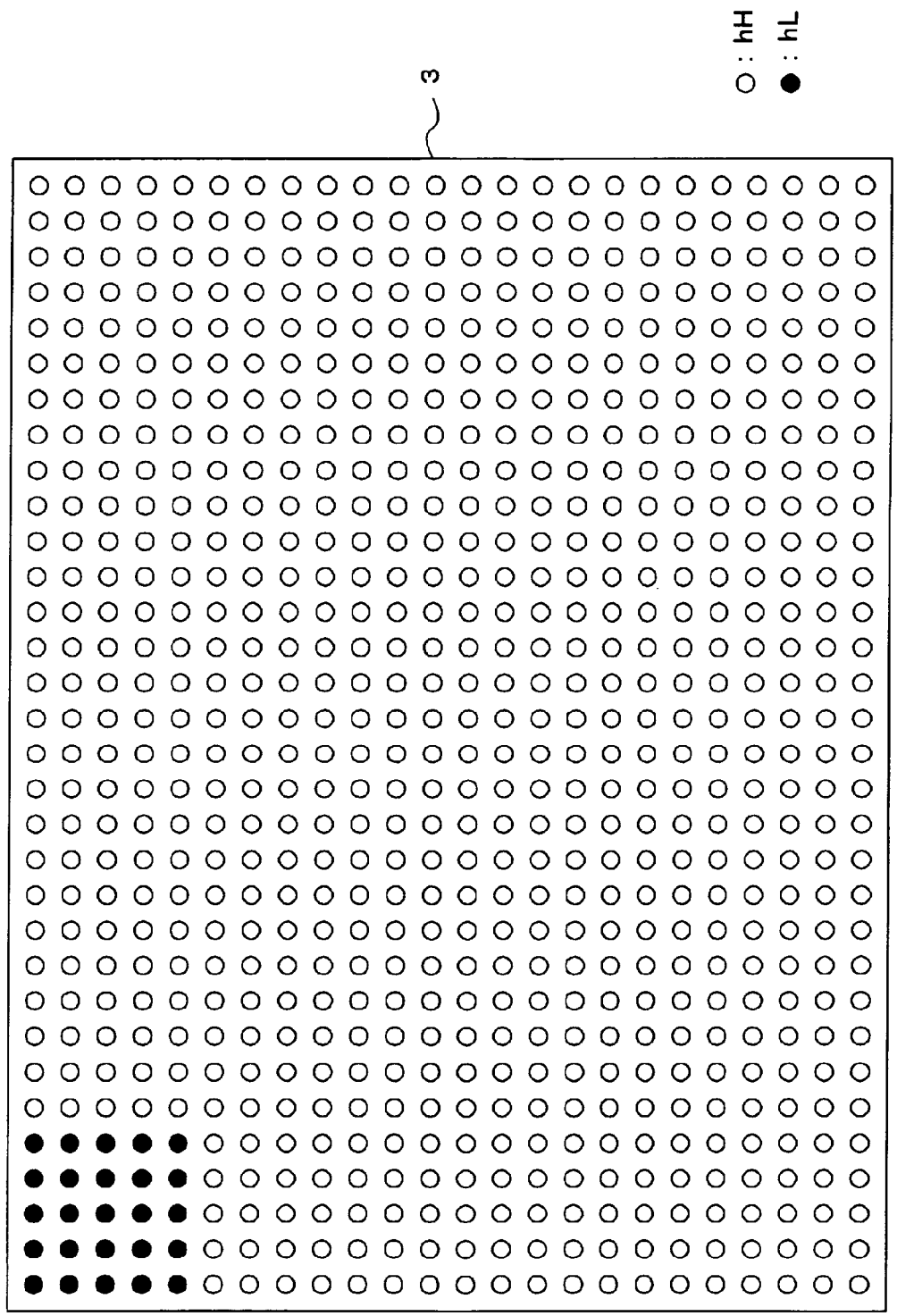
FIG. 11 is a schematic diagram showing an example of arrangement of first and second element holograms according to an embodiment of the present invention.

In an example shown in FIG. 11, a plurality of second element holograms hL, on which simplified-form data such as low-quality content data is recorded, are disposed in an upper left corner on the hologram memory 3.

Disposing the second element holograms hL in the upper left corner provides an advantage that these element holograms in the upper left corner are highly likely to be read first in a manual scanning operation performed by a user, because the scanning is most likely to be started from the left upper corner.

Figure 12:
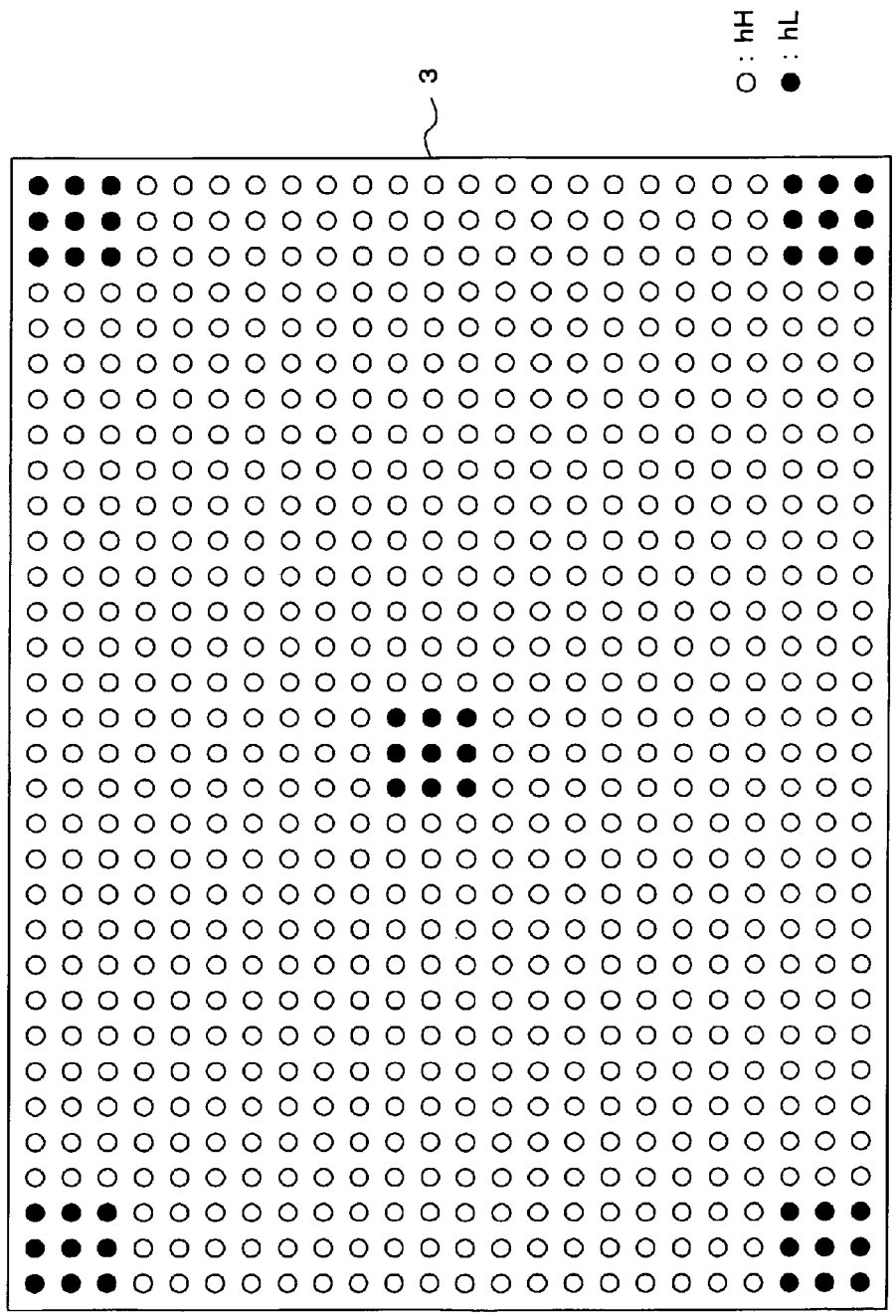
FIG. 12 is a schematic diagram showing an example of arrangement of first and second element holograms according to an embodiment of the present invention.

In an example shown in FIG. 12, a plurality of sets of second element holograms hL, on which simplified-form data such as low-quality content data is recorded, are disposed in a central area and in four corners on the hologram memory 3 so that one of the plurality of sets of second element holograms hL is read in an early stage of a scanning operation performed by a user.

An optimum area in which to dispose second element holograms hL depends on the number of element holograms necessary to record simplified-form data. In the example shown in FIGS. 9A to 9J, simplified-form data is divided into m blocks (sBLK1 to sBLKm) and recorded on m element holograms. However, depending on simplified-form data, there is a possibility that only one element hologram can record the entirety of simplified-form data.

In the case in which the entirety of simplified-form data can be recorded on one element hologram, each of the plurality of second element holograms hL shown in FIG. 10 or 11 records the entirety of simplified-form data.

In this case, when the central area of the hologram memory 3 shown in FIG. 10 or the upper left corner of the hologram memory 3 shown in FIG. 11 is scanned, the probability is very high that at least one of the plurality of element holograms hL is read. This allows it to complete the reading of simplified-form data in a short time.

In a case in which one piece of simplified-form data is divided into five blocks (sBLK1 to sBLK5) and the entirety of the one piece of simplified-form data is recorded using five element holograms, it is advantageous that each block be recorded on, for example, five element holograms hL and a total of twenty five element holograms hL be disposed as shown in FIG. 11. In the example shown in FIG. 11, second element holograms hL for the above purpose are disposed in an array of 5 rows×5 columns. In this array, for example, equal data of a block sBLK1 may be recorded on 5 element holograms hL in a first column, equal data of a block sBLK2 may be recorded on 5 element holograms hL in a second column, . . . , and equal data of a block sBLK5 may be recorded on 5 element holograms hL in a fifth column. This arrangement results in an increase in the probability that blocks sBLK1 to sBLK5 are quickly read when a user manually scans the hologram reader 6 to right and left in horizontal directions.

Figure 13:
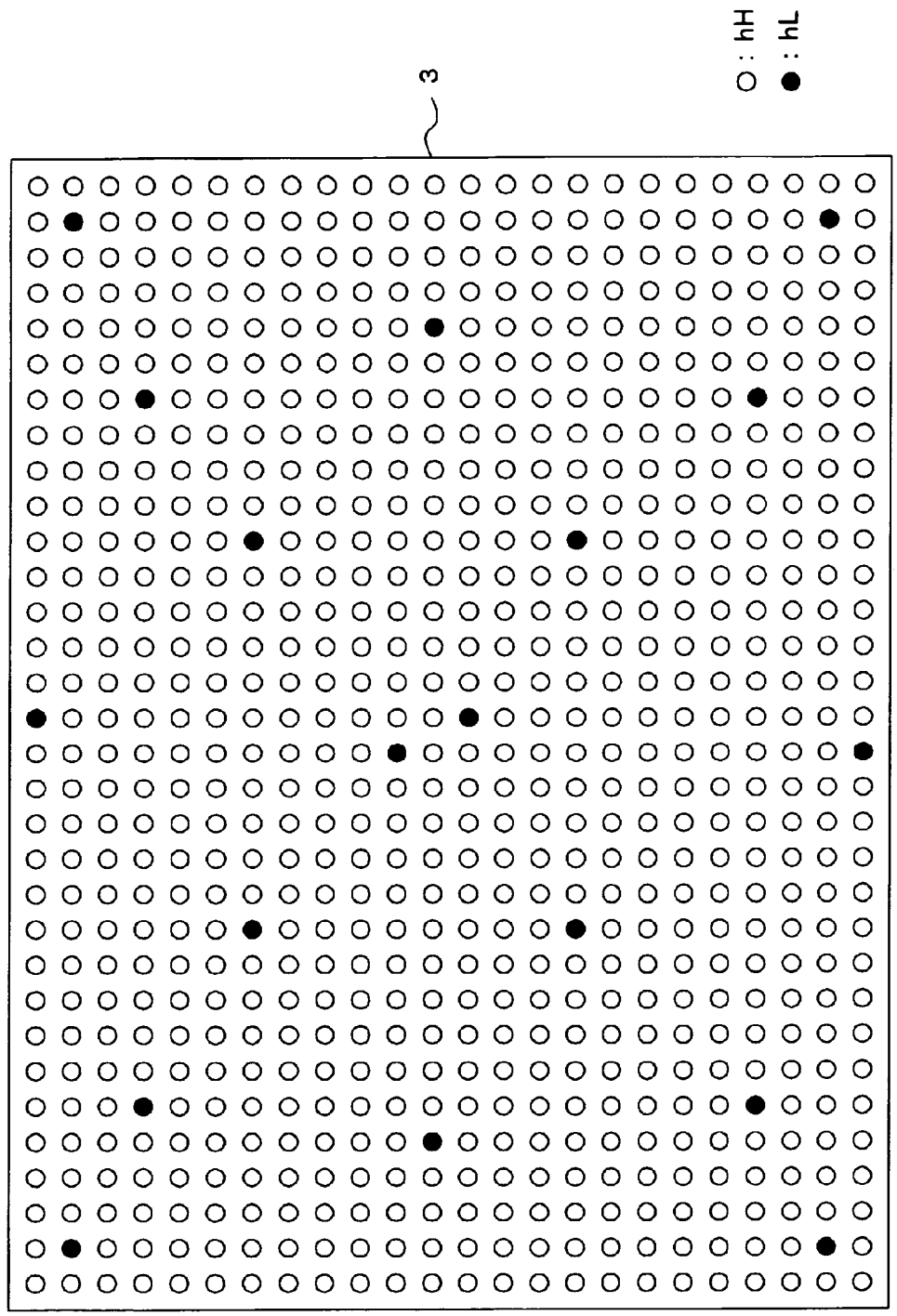
FIG. 13 is a schematic diagram showing an example of arrangement of first and second element holograms according to an embodiment of the present invention.

On the other hand, in the case in which m=1, that is, the entirety of simplified-form data can be recorded on one element hologram, it is preferable that a plurality of second element holograms hL on which the same simplified-form data are recorded be disposed at positions apart from each other as shown in FIG. 13. This arrangement allows an increase in the probability that at least one of these second element holograms hL is read regardless of the direction in which the hologram reader 6 is manually scanned by a user.

Figure 14:
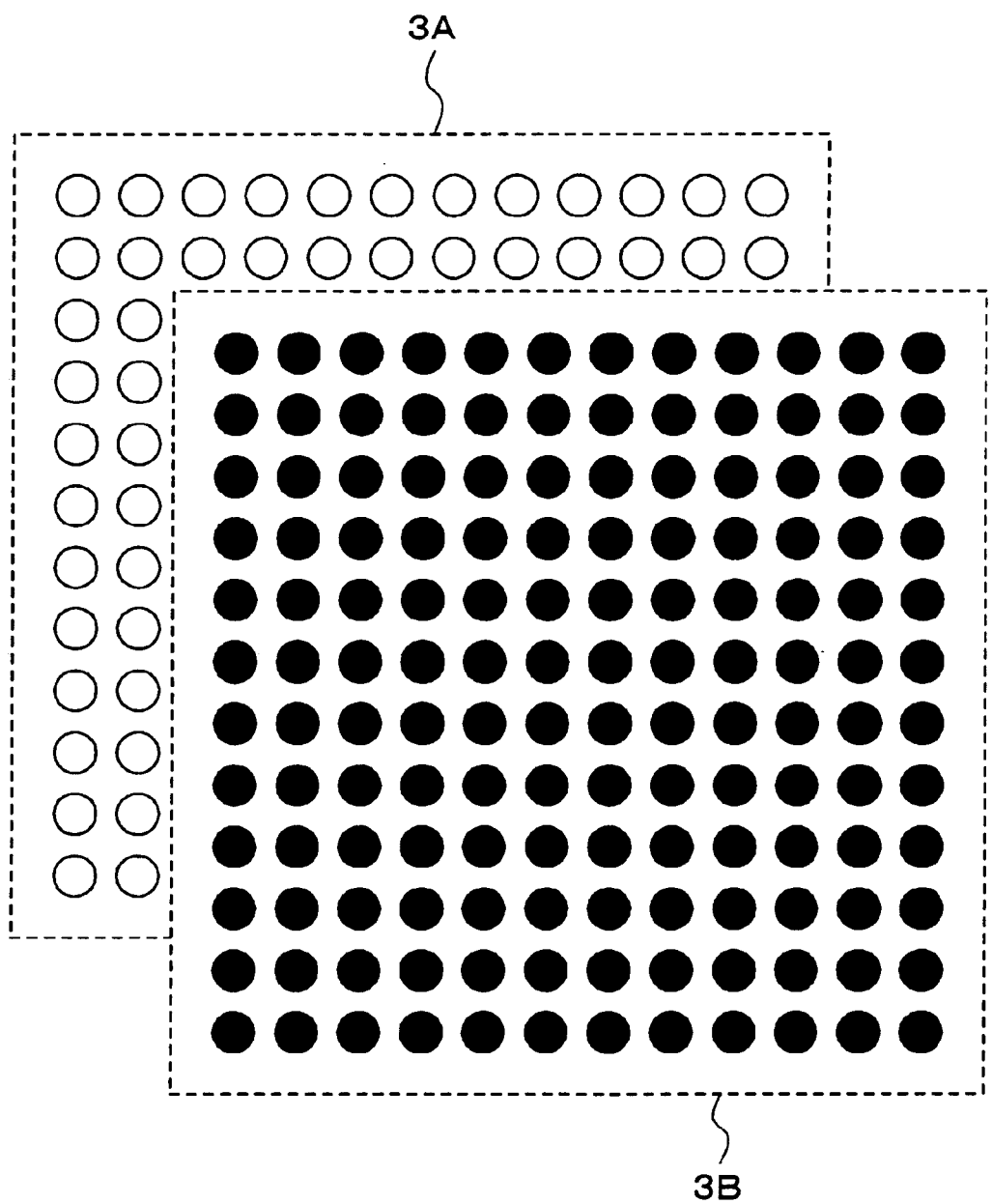
FIG. 14 is a schematic diagram showing an example of arrangement of first and second element holograms according to an embodiment of the present invention.

On the other hand, in the case in which element holograms are formed in the first plane 3A and the second plane 3B in the angle multiplexed fashion, the first plane 3A may be used for forming first element holograms hH and the second plane 3B may be used for forming second element holograms hL as shown in FIG. 14.

In a case in which simplified-form data can be entirely recorded on one second element hologram hL, scanning of the simplified-form data is completed when even only any one of the second element holograms hL formed in the second plane 3B has been read. Even in a case in which one piece of simplified-form data is recorded over a plurality of (m) element holograms, presence of many of duplicated blocks sBLK of the simplified-form data recorded as element holograms in the second plane 3B ensures a high probability of reading entire simplified-form data in a short time.

Note that in the angle multiplexing technique, the difference in the angle can be given not only by a difference in an incident angle with respect to a plane of a hologram memory but also by a difference in an angle in the plane.

Figure 15:
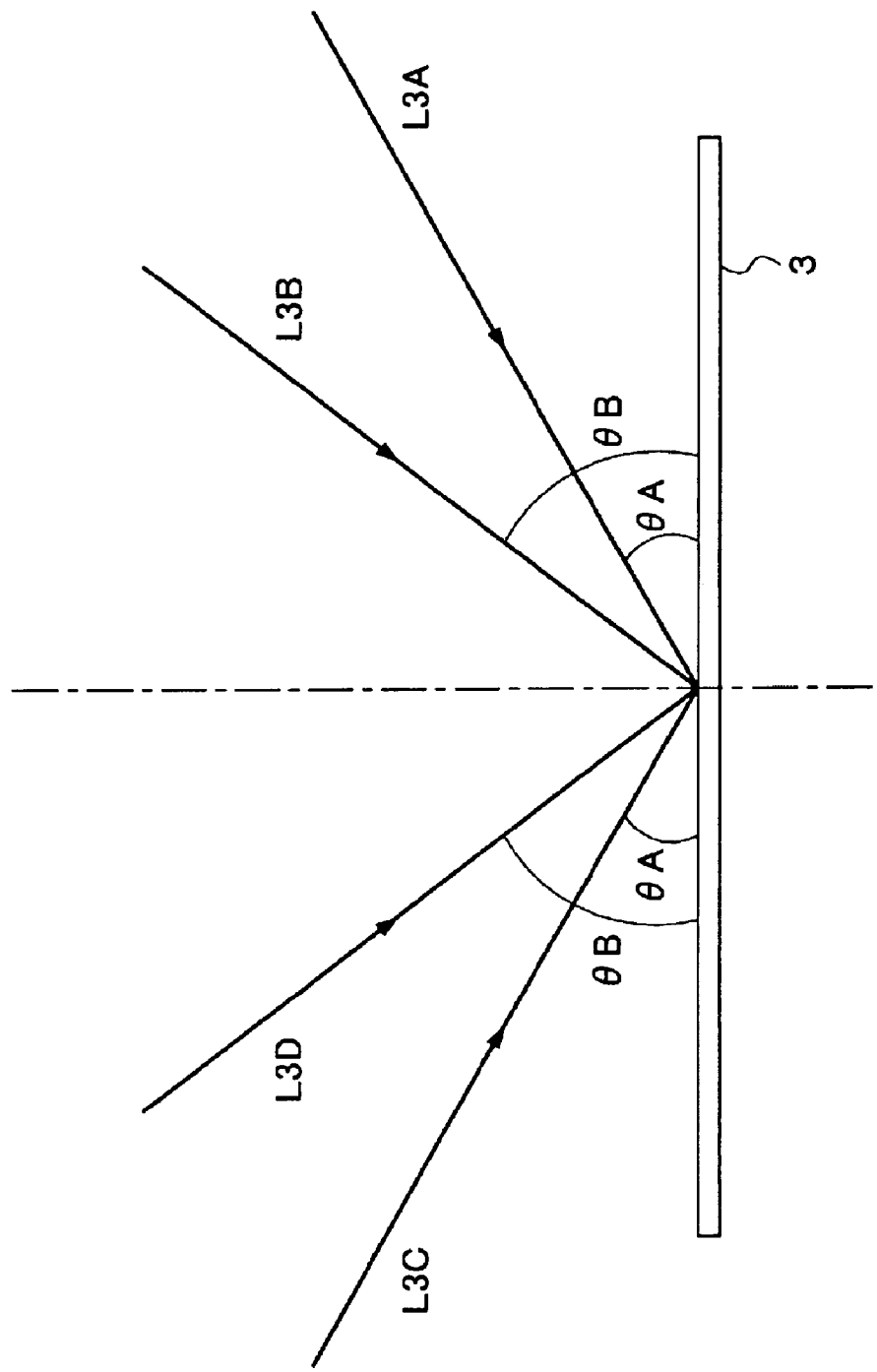
FIG. 15 is a schematic diagram showing an example of arrangement of first and second element holograms according to an embodiment of the present invention.

For example, element holograms hA and hB can be respectively formed in different planes (the first plane 3A and the second plane 3B, in the example shown in FIG. 5) by illuminating the hologram memory with recording reference light L3A or L3B with a different incident angle θA or θB as shown in FIG. 15. If the hologram memory is illuminated with recording reference light L3C having the same incident angle θA with respect to the plane of the hologram memory as the recording reference light L3A but having a different angle as measured in the plane, element holograms are formed in a third plane. Similarly, if the hologram memory is illuminated with recording reference light L3D having the same incident angle θB with respect to the plane of the hologram memory as the recording reference light L3B but having a different angle as measured in the plane, element holograms are formed in a fourth plane. In other words, if the hologram memory 3 on which element holograms are formed in the first plane 3A and the second plane 3B is scanned by the hologram reader 6 in a state in which the hologram memory 3 is rotated by 180° in the plane of the hologram memory 3, the element holograms are not correctly read. To avoid the above problem, when the first and second element holograms hH and hL are recorded as shown in FIG. 14, the first element holograms hH are also recorded using recording reference light L3C and the second element holograms hL are also recorded using recording reference light L3D. In reading of this hologram memory 3, it is possible to read the simplified-form data by illuminating the hologram memory 3 by reproduction reference light at an angle of θB and the main data at an angle of θA regardless of whether or not the relative position between the hologram memory 3 and the hologram reader 6 is rotated by 180°.

When both main data and simplified-form data are recorded on the hologram memory 3 in the above-described manner, the main data is intended to be primary data to be downloaded by the hologram reader 6, and the simplified-form data is intended to be auxiliary data with a less data size than the data size of the main data.

A wide variety of combinations of main data and simplified-form data is possible. Some examples of combinations are listed below, wherein <M> denotes main data and <S> denotes simplified-form data.

<M>: uncompressed audio or video content; <S>: compressed audio or video content <M>: audio or video content compressed at a small compression ratio; <S>: audio or video content compressed at a great compression ratio <M>: audio or video content sampled at a high sampling frequency; <S>: audio or video content sampled at a low sampling frequency <M>: audio or video content quantized with a great number of quantization bits; <S>: audio or video content quantized with a small number of quantization bits <M>: audio or video content with an original frequency characteristic; <S>: audio or video content produced by cutting a particular frequency band of original data <M>: audio or video content compressed using a high-quality compression method; <S>: audio or video content compressed using a low-quality compression method <M>: entire audio content; <S>: part of audio content such as an introduction part or a climax part extracted from the original content <M>: multi-channel stereo audio content; <S>: monophonic audio content <M>: entire moving video content; <S>: part of moving video content extracted from original moving video content <M>: entire moving video content; <S>: one or more frames of still images, a quasi-moving image, still images playable as a slideshow, or the like extracted from original moving video content <M>: original moving video content; <S>: digest of original moving video content <M>: video content including a large number of still images; <S>: video content including one or a small number of still images extracted from the large number of still images <M>: video content in the form of a high-resolution still image with a large number of pixels; <S>: video content in the form a low-resolution still image with a small number of pixels <M>: video content with an original screen size; <S>: video content with a reduced screen size (with a reduced number of pixels)

<M>: moving video content with an original frame rate; <S>: quasi-moving video content with a reduced frame rate <M>: color video content; <S>: monochrome video content <M>: full text data <S>: part of text data such as an outset <M>: full text data <S>: summary of text data <M>: program data with full functions <S>: program data with limited functions Some examples of combinations of main data and simplified-form data have been described above. Note that a further variety of combinations of main data and simplified-form data is possible.

The simplified-form data may include auxiliary or additional information. For example, when the main data is high-quality audio content, the simplified-form data may include, in addition to low-quality audio content, additional data such as a still image of an album jacket or an artist, text data indicating lyrics or a liner note, etc.

The main data and the simplified-form data do not necessarily need to be independent of each other.

For example, in a compression method known as ATRAC, original data is divided into a plurality of frequency bands, and compression is separately performed for each frequency band. Data of a particular frequency band may be recorded as simplified-form data, and data of the other frequency bands may be recorded as main data. In this case, low-quality of audio content can be played back by decoding only the data of the particular frequency band.

On the other hand, high-quality audio content can be played back by combining data decoded from the main data and data decoded from the simplified-form data.

That is, as with the example described above, one or more components of the data intended to be downloaded may be recorded as the simplified-form data such that the data can be obtained by combining the main data and the simplified-form data.

3. Configuration of Hologram Reader

Figure 16:
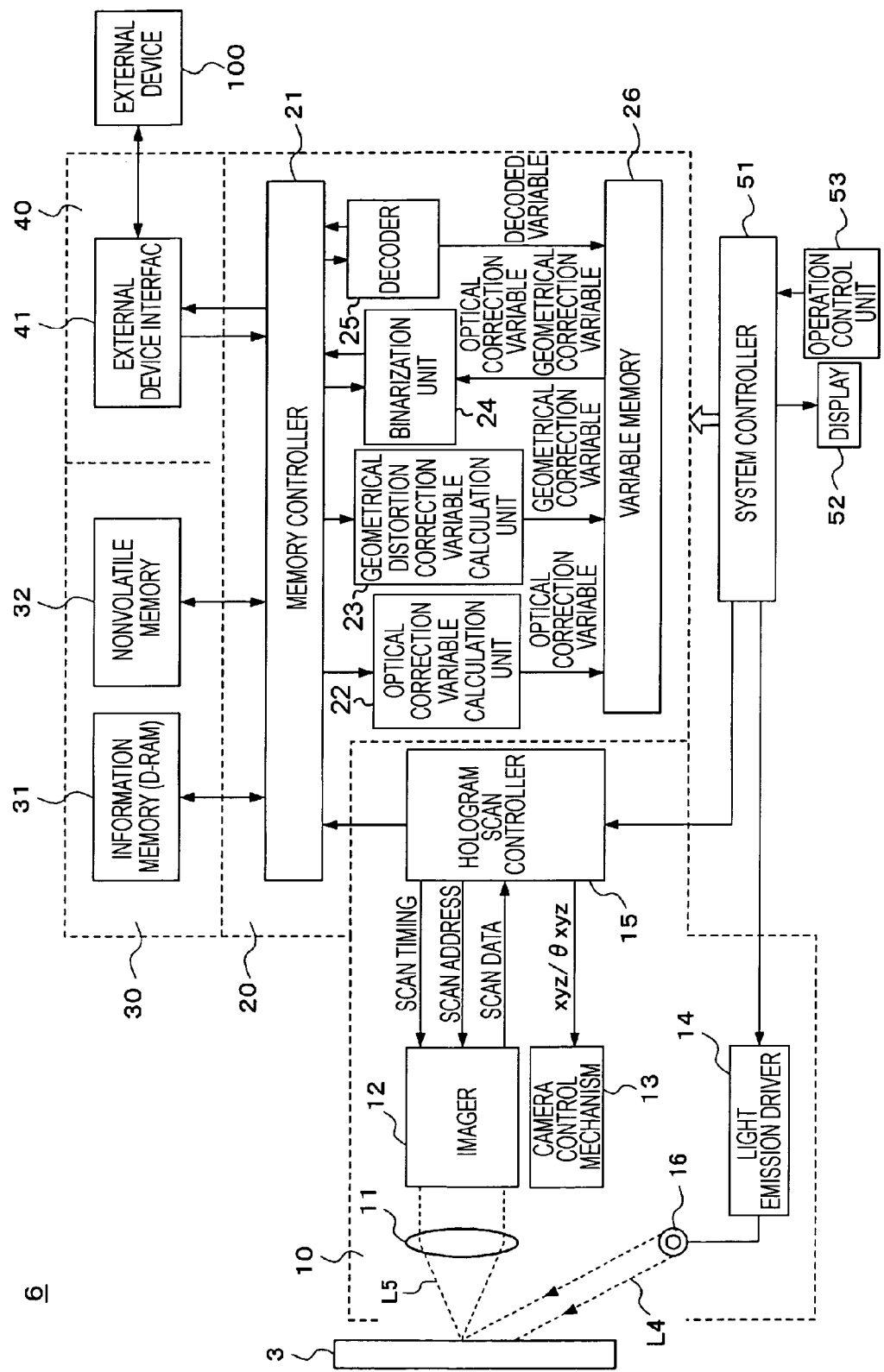
FIG. 16 is a block diagram of a hologram reader according to an embodiment of the present invention.

Referring to FIG. 16, a configuration of the hologram reader 6 (hologram reproducing apparatus) according to an embodiment of the present invention is described below.

The hologram reader 6 includes four blocks: an imaging block 10, a signal processing block 20, a memory block 30, and an external device interface block 40. These blocks operate under the control of a system controller 51.

The system controller 51 is realized, for example, by a microcomputer, and serves to control various parts in an operation of reading data from the hologram memory 3.

The system controller 51 also monitors an operation performed by a user on an operation control unit 53, and performs a control operation in accordance with the operation performed by the user. The system controller 51 also controls a display 52 to display various kinds of information to present them to a user.

The imaging block 10 is a block configured to take a two-dimensional image reproduced from element holograms formed on the hologram memory 3, and includes a collimator lens 11, an imager 12, a camera control mechanism 13, a light emission driver 14, a hologram scan controller 15, and a reference light source 16.

The collimator lens 11 and the imager 12 respectively corresponds to the collimator lens 4 and the imager 5 shown in FIG. 1B. The imager 12 is realized by a CMOS image sensor or a CCD image sensor adapted to detect a two-dimensional image.

The camera control mechanism 13 is a mechanism adapted to control the relative positions of the imager 12 (or the reference light source 16) and the hologram memory 3. The camera control mechanism 13 has a capability of manually or automatically controlling moving parts. In the case in which manual scanning is used as described above with reference to FIG. 7 or 8, the camera control mechanism 13 is unnecessary.

The reference light source 16 is disposed on the case of the hologram reader 6 so that reproduction reference light L4 emitted from the reference light source 16 falls on the hologram memory 3 at the same angle as the angle of the recording reference light L3 used in the recording process shown in FIG. 1. The reference light source 16 is realized, for example, by a LED (Light Emitting Diode) or a semiconductor laser, and is driven by the light source driver 14 to emit light therefrom. When data is read from the hologram memory 3 by using the hologram reader 6, the light source driver 14 drives the reference light source 16 under the control of the system controller 51 to emit light from the reference light source 16.

The hologram scan controller 15 determines the timing of taking an image of a hologram and determines a pixel to be read on the basis of the status of the two-dimensional images taken by the imager 12 and the status of data already stored in the variable memory 26, and the hologram scan controller 15 supplies a scan timing signal and a scan address signal to the imager 12 thereby controlling the operation of the imager 12. The hologram scan controller 15 also processes the two-dimensional image signal output from the imager 12.

The signal processing block 20 is a block configured to perform signal processing on a sequence of two-dimensional images taken by the imaging block 10, and includes a memory controller 21, an optical correction variable calculation unit 22, a geometrical distortion correction variable calculation unit 23, a binarization unit 24, a decoder 25, and a variable memory 26.

The memory controller 21 arbitrates conflict, in an operation of reading/writing data from/to the memory block 30, among the hologram scan controller 15, the optical correction variable calculation unit 22, the geometrical distortion correction variable calculation unit 23, the binarization unit 24, and the decoder 25.

The optical correction variable calculation unit 22 detects a variation in luminance in a two-dimensional image and determines optical distortion correction variables according to the detected variation.

The geometrical distortion correction variable calculation unit 23 detects geometrical distortion in a two-dimensional image and determines geometrical distortion correction variables according to the detected geometrical distortion.

The binarization unit 24 binarizes the two-dimensional image in accordance with the optical distortion correction variables and the geometrical distortion correction variables.

The decoder 25 decodes the data binarized by the binarization unit 24 to reproduce the information read from the hologram memory 3.

The variable memory 26 stores the optical distortion correction variables calculated by the optical correction variable calculation unit 22 and the geometrical distortion correction variables calculated by the geometrical distortion correction variable calculation unit 23.

The memory block 30 has capabilities of storing the two-dimensional image transmitted from the hologram scan controller 15, storing an intermediate result of the signal processing performed by the signal processing block 20, and storing the information decoded by the decoder 25. The memory block 30 includes an information memory 31 and a nonvolatile memory 32.

The information memory 31 is realized, for example, by a DRAM (Dynamic Random Access Memory) and is used as a storage area for storing the two-dimensional image transferred from the hologram scan controller 15. The two-dimensional image stored in the information memory 31 is read by the optical correction variable calculation unit 22, the geometrical distortion correction variable calculation unit 23, or the binarization unit 24 for use in processing performed thereby.

The nonvolatile memory 32 is used as a storage area for storing information such as audio/video information decoded by the decoder 25.

The external device interface block 40 includes an external device interface 41 and serves to transmit audio/video information or the like read by the hologram reader 6 to an external device 100.

In the process of reading data from the hologram memory 3, respective parts operate as follows.

To scan the hologram memory 3, the light source driver 14 drives the reference light source 16 to emit reproduction reference light L4 therefrom. As a result of illumination of the hologram memory 3 with the reproduction reference light L4, reproduced-image light of an element hologram is obtained and focused on the imager 12 via the collimator lens 4. The two-dimensional image focused on the imager 12 is converted into an electrical signal and supplied to the hologram scan controller 15.

The hologram scan controller 15 controls the operation of the imager 12 and processes the two-dimensional image signal output from the imager 12.

More specifically, the hologram scan controller 15 supplies control signals such as a scan timing signal, a scan address signal, etc. to the imager 12 thereby controlling the imager 12 so as to sequentially output a two-dimensional image signal sensed by a solid-state image sensor array. The hologram scan controller 15 performs a sampling process, an AGC process, an analog-to-digital conversion process, etc. on the two-dimensional image signal output from the imager 12.

The resultant digital two-dimensional image signal output from the hologram scan controller 15 is stored in the information memory 31 under the control of the memory controller 21.

The two-dimensional image signal stored in the information memory 31 is read by the optical correction variable calculation unit 22 and optical distortion correction variables are calculated. More specifically, if the optical correction variable calculation unit 22 receives the two-dimensional image signal from the information memory 31, the optical correction variable calculation unit 22 calculates optical distortion correction variables by which to correct optical distortion appearing as a variation in data values and to adjust luminance. The optical correction variable calculation unit 22 stores the calculated optical distortion correction variables into the variable memory 26.

Note that the optical correction variable calculation unit 22 does not perform the optical correction process on the two-dimensional image signal but performs only the process of calculating the optical distortion correction variables and storing the calculated optical distortion correction variables into the variable memory 26. That is, the optical correction variable calculation unit 22 does not perform the process of correcting the two-dimensional image signal and storing the corrected two-dimensional image signal into the information memory 31.

The two-dimensional image signal stored in the information memory 31 is read by the geometrical distortion correction variable calculation unit 23 and geometrical distortion correction variables are calculated. More specifically, the two-dimensional image signal is supplied from the information memory 31 to the geometrical distortion correction variable calculation unit 23, and the geometrical distortion correction variable calculation unit 23 calculates geometrical distortion correction variables by which to correct geometrical distortion such as an image position shift and/or a rotational image shift according to the supplied two-dimensional image signal. The geometrical distortion correction variable calculation unit 23 stores the resultant calculated geometrical distortion correction variables into the variable memory 26.

Note that the geometrical distortion correction variable calculation unit 23 does not perform the geometrical distortion correction process on the two-dimensional image signal but performs only the process of calculating the geometrical distortion correction variables and storing the calculated geometrical distortion correction variables into the variable memory 26. That is, the geometrical distortion correction variable calculation unit 23 does not perform the process of correcting the two-dimensional image signal and storing the corrected two-dimensional image signal into the information memory 31.

After the optical distortion correction variables and the geometrical distortion correction variables have been calculated by the optical correction variable calculation unit 22 and the geometrical distortion correction variable calculation unit 23 and stored in the variable memory 26, the two-dimensional image signal is transferred from the information memory 31 to the binarization unit 24 and binarized. That is, the two-dimensional image signal output from the imager 12 is in the form of halftone image data, and this halftone image data is converted into two-level (black/white level) image data, because the original two-dimensional page data recorded on the hologram memory 3 is in the form of two-level data.

In the binarization process performed on the two-dimensional image signal by the binarization unit 24, the optical distortion correction variables and the geometrical distortion correction variables stored in the variable memory 26 are used. More specifically, the coordinates of the two-dimensional image signal read from the information memory 31 are adjusted on the basis of the geometrical distortion correction variables, and the threshold value used in the binarization is set on the basis of the optical distortion correction variables.

Note that because the binarization process is performed by the binarization unit 24 using the optical distortion correction variables and the geometrical distortion correction variables, the resultant binarized two-dimensional image signal has been corrected in terms of the optical correction and the geometrical distortion.

The resultant binarized two-dimensional image signal output from the binarization unit 24 is supplied directly, or indirectly via the information memory 31, to the decoder 25.

The decoder 25 performs a decoding process and an error correction process on the binarized two-dimensional image signal, which is data originating from one element hologram, thereby obtaining the original data.

The decoder 25 supplies the resultant decoded data to the memory controller 21. The memory controller 21 stores the received data into the nonvolatile memory 32.

The amount of decoded data collected in the nonvolatile memory 32 increases with the progress of the process of acquiring the two-dimensional image signal from the element holograms on the hologram memory 3, decoding the acquired signal by the decoder 25, and storing the decoded data into the nonvolatile memory 32. When as much decoded data has been collected as necessary to reproduce the original data such as audio visual content data or computer data recorded on the hologram memory 3, the original data is reproduced by reconstructing the data collected in the nonvolatile memory 32.

The data reconstructed on the nonvolatile memory 32 is supplied as reproduced data of the hologram memory 3 via the external device interface 41 to an external device 100 such as a personal computer, an audio player, an AV (Audio Visual) device such as a video player, or a portable telephone. The external device interface 26 may be, for example, an USB interface, although the external device interface 26 is not limited to the USB interface and other types of interfaces may be used. A user is allowed to use the data reproduced from the hologram memory 3 on the external device 100. For example, the data reproduced from the hologram memory 3 may be used as computer data on a personal computer, or may be played back as AV content data on an AV device or a portable telephone.

Although not shown in the figures, a medium drive for recording data on a storage medium may be provided, and reproduced data may be recorded on the storage medium using the medium drive.

Specific examples of storage media include an optical disk and a magnetooptical disk. For example, a portable storage medium such as a CD (Compact Disc), a DVD (Digital Versatile Disc), a Blu-Ray disc, a MD (Mini Disc), or the like may be employed. When such a disk is used as a recording medium, the medium drive performs processing such as encoding, error correction, and compression on the data to be written depending on the type of the disk and writes the resultant data on the disk.

A hard disk is also employable as the recording medium. When a hard disk is used, the medium drive is configured as a HDD (Hard Disk Drive).

A portable memory card including a built-in solid state memory may also be used as the recording medium. A solid state memory may be disposed in the inside of the medium drive. In such a case, the medium drive is configured so as to function as a recording unit for performing necessary signal process on data and writing the resultant data in the memory card or in the solid state memory disposed in the recording unit.

Data such as audio visual content data or the like recorded on a recording medium may be read by a medium drive, and the read data may be decoded and output by an audio output unit or a video output unit disposed in the medium drive.

The data reproduced using the medium drive may be transferred to an external device via the external device interface 41.

When data is stored on a portable storage medium such as a CD, a DVD, a Blu-Ray disk, a mini-disk, or a memory card, a user is allowed to use reproduced data read from the hologram memory 3 by reading the data from the storage medium using the external device.

When it is allowed to assume that the operation (data downloading operation) of reproducing data from the hologram memory 3 by scanning the hologram memory 3 is not performed concurrently with the operation of transferring the obtained data such as audio/video data to the external device 100 or the operation of outputting the data by the audio/video output unit, one or both of the information memory 31 and the nonvolatile memory 32 in the memory block 30 may be replaced with another storage means disposed in the reproducing apparatus. This allows simplification of the memory organization.

When the decoded data is recorded on a recording medium such as an optical disk or a HDD as described above, data may be stored in the information memory 31 during the process until the reproduced data is obtained, and the nonvolatile memory 32 may be removed.

4. First Example of Reproduction Process

Figure 18:
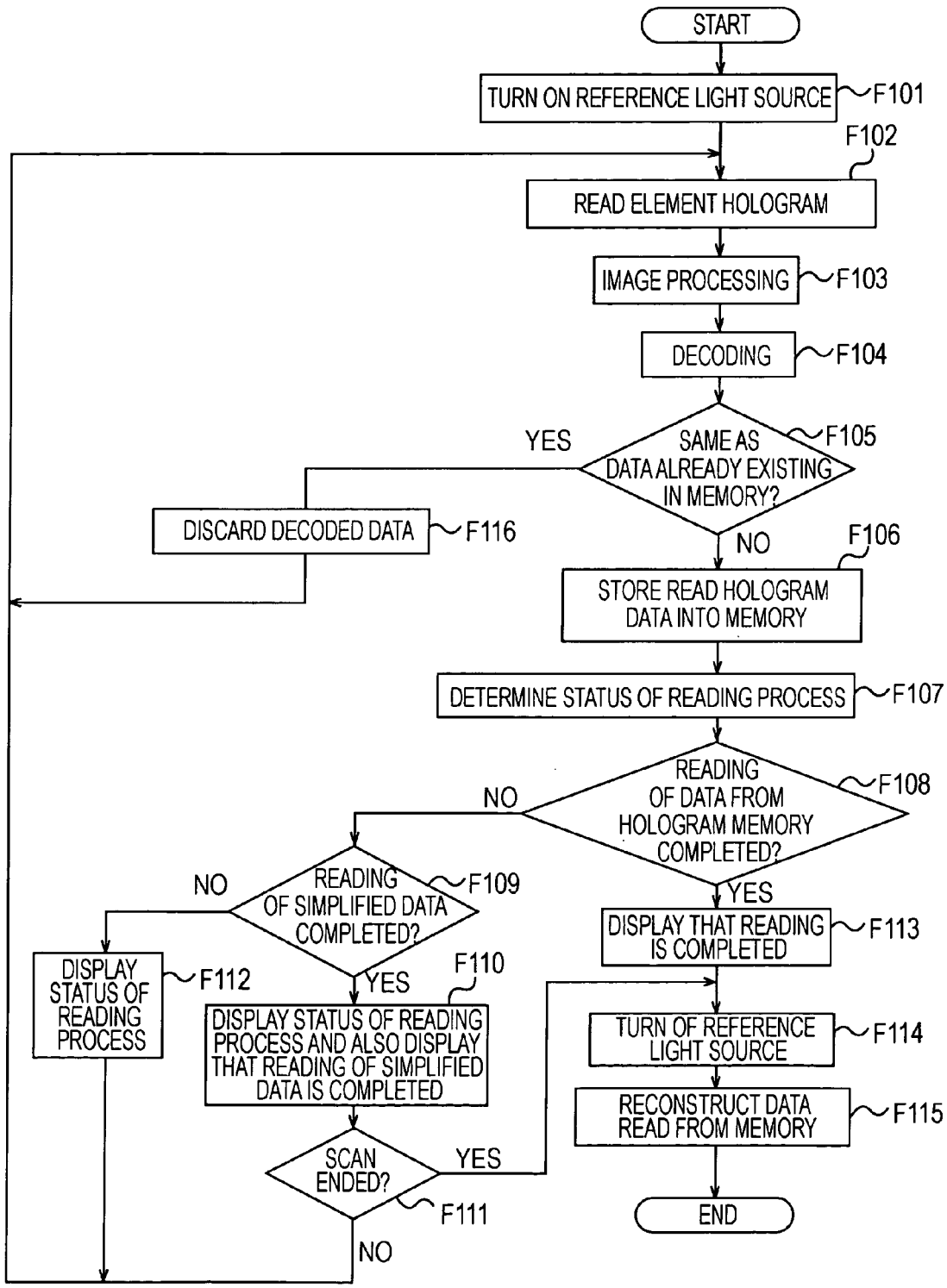
FIG. 18 is a flow chart showing a process of reproducing data by using a hologram reader according to an embodiment of the present invention.

Referring to FIG. 18, a first example of reproducing data from the hologram memory 3 using the hologram memory 6 is described below. In the following description, it is assumed that the hologram memory 3 has data recorded in first and second holograms hH and hL in any one of manners described above with reference to FIGS. 10 to 13. FIG. 18 shows a data reproduction process performed under the control of the system controller 51.

After a user inputs a reproduction process start command via the operation control unit 53, the user arbitrarily movies the hologram reader 6 over the hologram memory 3 as shown in FIG. 7 or 8.

If the system controller 51 detects the reproduction process start command input via the operation control unit 53, the system controller 51 turns on the reference light source 16 in step F101. More specifically, the system controller 51 issues a command to the light source driver 14 to drive the reference light source 16 to emit reproduction reference light L4 such that the hologram memory 3 is illuminated with the reproduction reference light L4.

In this state, if the user moves the hologram reader 6 over the hologram memory 3, reproduced-image light L5 from element holograms on the hologram memory 3 are sequentially detected by the imager 12.

In the case in which the hologram reader 6 has the camera control mechanism 13 and the scanning position is controlled by the camera control mechanism 13, the system controller 51 issues a command to the hologram scan controller 15 to start the operation of the camera control mechanism 13 at the beginning of the scanning operation. In the following explanation, it is assumed that the hologram reader 6 does not have the camera control mechanism 13 and thus the scanning is performed manually.

In step F102, a digital data of a two-dimensional image of an element hologram is obtained as a result of the process performed by the imager 12 and the hologram scan controller 15.

The hologram scan controller 15 performs necessary signal processing and analog-to-digital conversion on the image signal output from the imager 12 and transfers the resultant signal as the two-dimensional image signal of the element hologram to the memory controller 21. The memory controller 21 stores the received signal in the information memory 31.

If the system controller 51 detects that the two-dimensional image signal of the element hologram has been obtained in step F102, the system controller 51 controls the process such that the two-dimensional image signal is subjected to image processing in step F103 and decoding in step F104.

More specifically, in step F103, the two-dimensional image signal stored in the information memory 31 is processed by the optical correction variable calculation unit 22 and the geometrical distortion correction variable calculation unit 23.

In step F104, the two-dimensional image signal is processed by the binarization unit 24 and the decoder 25. As a result, decoded data is obtained.

If data has been decoded for a certain element hologram in step F104, then in step F105, a determination is made as to whether the decoded data is identical to data which has already been decoded and stored in the nonvolatile memory 32. The determination is made, for example, by detecting an address or a data block number included in the decoded data, and checking whether the same address or the same data block is described in any existing data stored in the nonvolatile memory 32. It is desirable to determine whether the decoded data is simplified-form data or content data on the basis of the quality classification information, and make the above determination as to whether the same data as the current decoded data is already stored in the nonvolatile memory 32 by checking a particular storage area depending on whether the decoded data is simplified-form data or content data.

The same data as the current decoded data is found in the nonvolatile memory 32 if the same element hologram has already been read during the scanning process. That is, there is a possibility that the same element hologram is read a plurality of times when the hologram memory 3 is manually scanned by a user in the above-described manner.

There is also a probability that the same data is found in the nonvolatile memory 32, when scanning is performed for a hologram memory 3 on which the same data (the same two-dimensional image DP) is recorded on a plurality of element holograms, if the same data has already been read from any one of these element holograms and stored in the nonvolatile memory 32.

In a case in which it is determined in step F105 that the same data as the current decoded data exists in the nonvolatile memory 32, the process proceeds to step F116. In step F116, the current decoded data read from the element hologram is discarded, and the process then returns to step F102. This occurs, as described above, when the same element hologram has already been read, or when the same data has been read from any one of a plurality of element holograms on which the same data is recorded.

Although not shown in FIG. 18, there is a possibility that an error occurs in step F104. In such a case, the data is discarded and the process returns to step F102.

On the other hand, if it is determined in step F105 that the current data is not identical to any data existing in the nonvolatile memory 32, then the process proceeds to step F106. In step F106, the current decoded data is stored as data read from the particular element hologram into the nonvolatile memory 32. In the case in which the nonvolatile memory 32 is configured to have a plurality of storage areas such that data is stored in particular one of storage areas depending on whether the data is simplified-form data or content data, the type of the data is determined on the basis of the quality classification information and the data is stored in a proper one of the storage areas depending on the detected data type.

In step F107, the data reading status is determined.

Although in the present example, the data reading status is determined only for the content data, the data reading status may also be determined separately for the simplified-form data if the simplified-form data has a large data size.

As described above, in the data reading operation from the hologram memory 3, data recorded as one two-dimensional image DP corresponding to one block of the original content data is read from each element hologram. In other words, the reading of data from the hologram memory 3 is an operation of reading the original content data on a block-by-block basis, and the reading is performed until data of all blocks necessary to reproduce the original content data has been obtained. That is, the reading of element holograms is continued until all data necessary to reproduce the original content data has been collected. When all data of blocks necessary to reproduce the original content data has been collected, it is determined that 100% of reading operation is completed.

That is, the determination on the data reading status in step F107 is made by calculating what percent of the entire data has been decoded and stored in the nonvolatile memory 32.

Note that in the present example, content data is recorded as the main data in the first element holograms hH and low-quality content data is recorded as the simplified-form data in the second element holograms hL.

In the case in which element holograms hH and hL are formed on the hologram memory 3 in a mixed-up manner as in the examples shown in FIGS. 10 to 13, the first and second element holograms hH and hL are read in random order.

Thus, the determination of the data reading status in step F107 is made separately for the main data and the simplified-form data.

For the above purpose, for example, head information including information indicating the total data size of the main data and the number of data blocks into which the main data has been divided is attached to the data recorded on the first element holograms hH, and, similarly, head information including information indicating the total data size of the simplified-form data and the number of data blocks into which the simplified-form data has been divided is attached to the data recorded on the second element holograms hL. This makes it possible for the system controller 51 to acquire information indicating the total data size of the content data to be read as the main data and the total number of data blocks associated with the content data at a point of time at which decoding of data of first one of the first element holograms hH is completed. Similarly, at a point of time at which decoding of data of first one of the second element holograms hL is completed, the system controller 51 can acquire information indicating the total data size of the low-quality content data to be read as the simplified-form data and the total number of data blocks associated with the low-quality content data.

More specifically, the data reading status can be determined by calculating the percentage of the data size of the data which has already been read and stored in the nonvolatile memory 32 with respect to the total data size of the data to be read separately for the main data and the simplified-form data. Alternatively, the percentage of the process which has already been completed with respect to the process to be performed may be calculated on the basis of the number of blocks of data already read and stored in the nonvolatile memory 32 with respect to the total number of blocks of the data to be read.

The determination in step F111 as to whether the reading of the main data or the simplified-form data is 100% completed, that is, as to whether the reading of element holograms is completed is made on the basis of the determination as to whether data necessary to reconstruct the entire main data or simplified-form data has been obtained, and it is not necessary to determine whether all first element holograms hH (or all second element holograms hL) of the hologram memory 3 have been read.

This is because there can be a plurality of element holograms on which the same data is recorded. There is also a possibility that the original main data or simplified-form data can be reproduced from partial data by means of error correction or data interpolation, without having to read all data blocks.

In step F108, it is determined whether reading of data from the hologram memory 3 is completed. This determination is made by determining whether all data blocks necessary to reconstruct the main data have been read and stored in the nonvolatile memory 32.

If the determination in the previous step F107 as to the data reading status for the main data is made that the reading process is 100% is completed, the determination in step F108 is made that the reading of data from the hologram memory is completed.

In this determination, at the point of time at which the reading of 100% of main data is completed, it is allowed to determine that the reading of data from the hologram memory is completed, even if 100% of simplified-form data has not yet been read.

On the other hand, if 100% of main data has not yet been read, and thus it is determined in step F108 that reading of data from the hologram memory 3 is not completed, the process proceeds to step F109. In step F109, a determination is made as to whether reading of simplified-form data is completed. If the determination in step F107 is made that 100% of simplified-form data has not yet been read, then the answer to step F109 is negative, and thus the process proceeds to step F112. In step F112, the data reading status is displayed on the display 52.

The displaying of the data reading status in step F112 is performed on the basis of the result of the calculation performed in step F107 as to the percentage of main data which has already been read. For example, the data reading status is indicated by displaying a data reading status bar 60 shown in FIG. 16A.

The processing flow then returns to step F102 to repeat the process described above.

As described above, second element holograms hL on which the simplified-form data is recorded are disposed at positions that are likely to be scanned with a high scanning probability, and the simplified-form data is small in data size compared with the main data. In some cases, one element hologram hL includes the entire simplified-form data.

This means that reading of the entire simplified-form data can be completed at a rather early stage of the scanning process.

Therefore, in almost all cases, it is determined in step F109 that the reading of the simplified-form data is completed, before it is determined in step F108 that the reading of the hologram memory (the reading of the main data) is completed.

In the process performed after it is determined that 100% of simplified-form data has been read, the processing flow jumps from step F109 to step F110.

In step F110, the data reading status as to the main data is displayed, and a message is also displayed to inform a user that reading of simplified-form data is complete. For example, as shown in FIG. 17C, the system controller 51 indicates the data reading status by displaying the data reading status bar 60 on the display 52 and also displays a message to indicate that reading of the simplified-form data is complete.

In step F111, the system controller 51 determines whether a user has issued a scan end command. This is accomplished, for example, by monitoring the operation control unit 53 to detect a scan end command input via the operation control unit 53. Alternatively, it may be determined that scanning is ended when it is detected that the user ended the manual scanning operation. More specifically, when a two-dimensional image of an element hologram is not taken over a period with a length greater than a predetermined value, it is determined that the user has ended the manual scanning operation.

Conversely, if the intention of the user to end the scanning operation is not detected, the processing flow returns to step F102 to repeat the process described above.

Figure 17A:
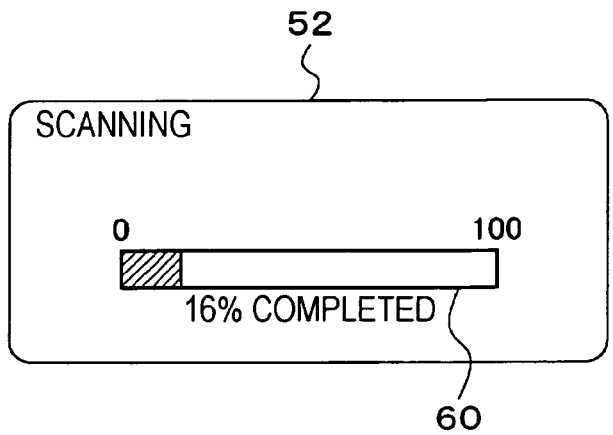
FIG. 17A is a diagram showing an example of a manner in which a data reading status is indicated by displaying information on a display (in this specific example, the information displayed on the display indicates that data is being read)
Figure 17B:
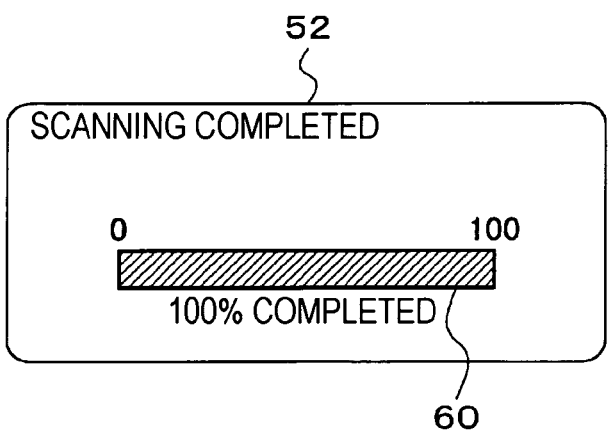
FIG. 17B is a diagram showing an example of a manner in which a data reading status is indicated by displaying information on a display (in this specific example, the information displayed on the display indicates that reading of data is 100% completed)
Figure 17C:
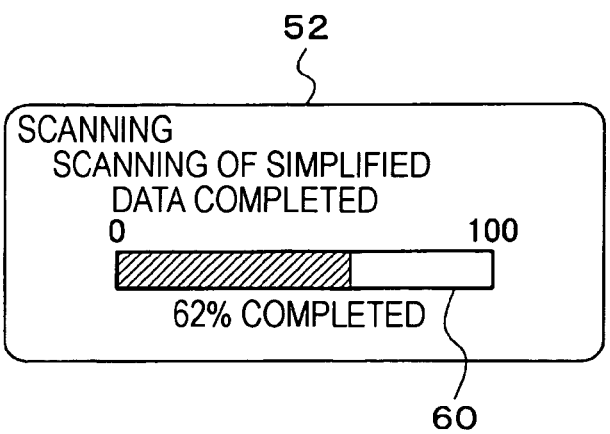
FIG. 17C is a diagram showing an example of a manner in which a data reading status is indicated by displaying information on a display (in this specific example, the information displayed on the display indicates that reading of simplified-form data is completed and main data is being read)

As the process proceeds in the following data reading process, the displayed percentage of completion of the process increases as shown in FIG. 17C. Note that in this case, a message indicating the reading of the simplified-form data is also displayed.

During the above process, element holograms of the hologram memory 3 are read in random order as the user manually scans the hologram reader 6.

As the data reading process proceeds, the percentage indicated by the data reading status bar 60 displayed on the display 52 increases. This allows the user to recognize how long to continue the manual scanning operation.

If it is determined in step F108 that reading of the hologram memory 3 is completed, then the process proceeds to step F113 to display on the display 52 information indicating that reading of the hologram memory 3 is completed. More specifically, for example, as shown in FIG. 17B, the data reading status bar 60 is extended to the full length and numeric information is displayed to indicate that 100% of the scanning process is completed. A further message may be displayed to prompt the user to stop the manual scanning.

Thereafter, in step F114, the system controller 51 controls the light source driver 14 to turn off the reference light source 16. In step F115, the system controller 51 controls the memory controller 21 to reconstruct the data on the basis of the data stored in the nonvolatile memory 32. More specifically, from the block data, which has been stored in the nonvolatile memory 32 by this point of time and which is sufficient to reproduce the main data, the main data is produced by arranging the data blocks in a correct block order.

For example, content data is reproduced as a result of the above process. The resultant reproduced data is output to the external device 100 via the external device interface 41 so that the user can use the reproduced data on the external device 100.

When the reproduction of the main data recorded on the hologram memory 3 is completed, the system controller 51 ends the reproduction process.

In many cases, at the point of time at which step F115 is performed, data blocks of the simplified-form data have already been stored in the nonvolatile memory 32. However, if the user has continued the manual scanning until it is determined in step F108 that reading of the hologram memory 3 is completed, it can be concluded that the intention of the user is to acquire not the simplified-form data but the main data.

In this case, in step F115, the main data is reconstructed and the data blocks associated with the simplified-form data may be discarded, although the simplified-form data may also be reconstructed in addition to the main data. In a case in which the simplified-form data includes auxiliary or additional data in addition to the low-quality content data corresponding to the main data, it is desirable to also reconstruct the simplified-form data.

There is a possibility that before it is determined in step F108 that reading of the hologram memory is completed, it is determined in step F111 that the scanning operation is ended. This can occur when the intention of the user is to acquire the simplified-form data. That is, the user ends the scanning operation when reading of the simplified-form data is completed. In this case, the system controller 51 advances the processing flow to step F114 and controls the light source driver 14 to turn off the reference light source 16. Furthermore, in step F115, the system controller 51 controls the memory controller 21 to perform data reconstruction on the basis of the data stored in the nonvolatile memory 32. In this case, block data sufficient to reproduce the simplified-form data has already been stored in the nonvolatile memory 32, and thus the simplified-form data is produced by arranging these data blocks in a correct block order. Note that, depending on the simplified-form data, the simplified-form data can be reproduced only from data read from a single element hologram hL without having to combine a plurality of data blocks.

When the simplified-form data such as low-quality content data is reproduced in the above-described manner, the resultant reproduced data is output to the external device 100 via the external device interface 41 so that the user can use the reproduced data on the external device 100.

As described above, there is a high probability that reading of the entire simplified-form data is completed at an early stage of the scanning operation using the hologram reader 6. When the intention of the user is to acquire only the simplified-form data, the user is allowed to end the scanning operation at the point of time at which the entire simplified-form data has been read. This means that it is allowed to complete the scanning operation in a very short time when only the simplified-form data is needed.

On the other hand, when the main data is needed, the scanning operation is continued until it is determined in step F108 that reading is completed. In this case, it is allowed to acquire high-quality data such as music data or a computer program.

That is, the user is allowed to perform the scanning operation in a different manner depending on what data the user wants to acquire, the situation, the preference of the user, etc., that is, for example, depending on whether to acquire low-quality data in a short time or acquire high-quality data even if a longer time is needed.

5. Second Example of Reproduction Process

An example of a process of reproducing data recorded in the angle-multiplexed fashion on the first and second element holograms hH and hL on the hologram memory 3 as shown in FIG. 14 is described below.

Figure 19:
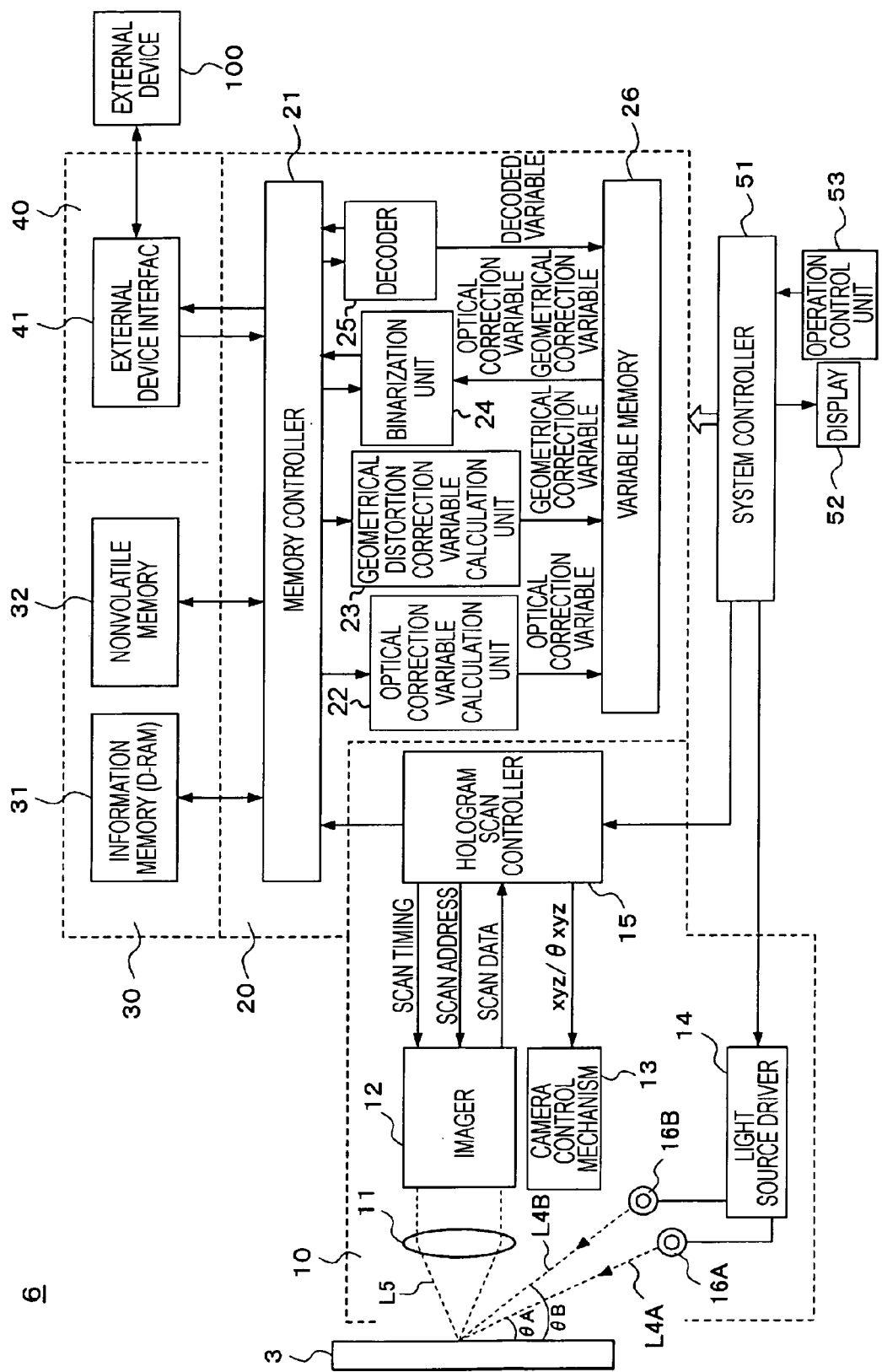
FIG. 19 is a block diagram of a hologram reader according to an embodiment of the present invention.

To correctly reproduce data from angle-multiplexed data, it is required that the hologram reader 6 be configured, for example, as shown in FIG. 19.

In FIG. 19, similar parts to those in FIG. 16 are denoted by similar reference numerals. The configuration shown in FIG. 19 is different from that shown in FIG. 16 in that the configuration includes two reference light sources, that is a reference light source 16A adapted to emit reproduction reference light L4A such that the reproduction reference light L4A falls on the hologram memory 3 at a first angle θA, and a reference light source 16B adapted to emit reproduction reference light L4B such that the reproduction reference light L4B falls on the hologram memory 3 at a second angle θB. These reference light sources 16A and 16B are driven to be turned on/off by the light source driver 14 under the control of the system controller 51.

Figure 20:
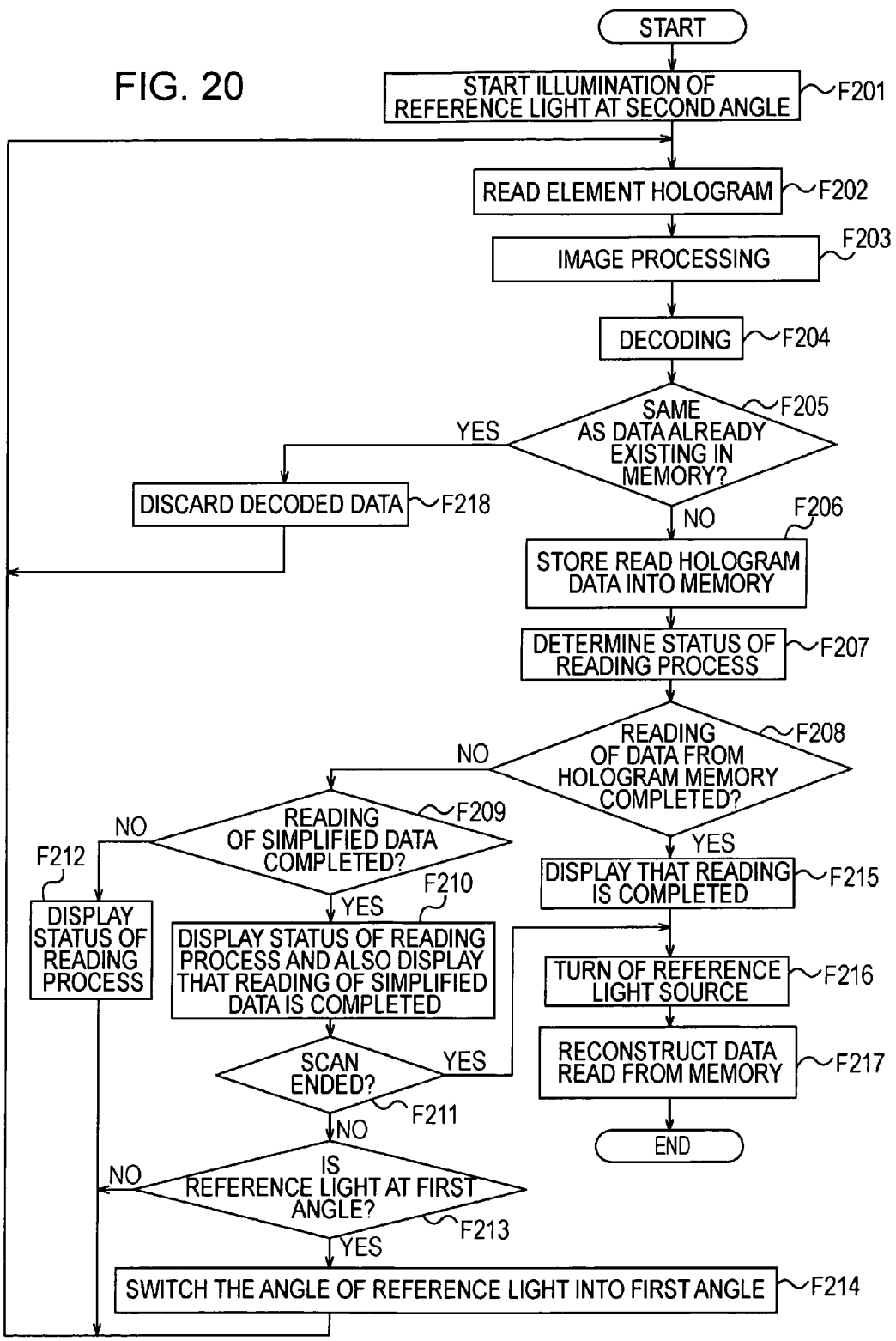
FIG. 20 is a flow chart showing a process of reproducing data by using a hologram reader according to an embodiment of the present invention.

FIG. 20 shows a process of scanning the hologram memory 3 shown in FIG. 14 and reproducing data recorded on the hologram memory 3.

At the beginning of the process, in step F201, the system controller 51 controls the light source driver 14 to drive the reference light source 16B to emit reproduction reference light L4B such that the reproduction reference light L4B falls on the hologram memory 3 at the second angle θB.

While maintaining this state, the following steps from step F202 are performed. Steps F202 to F212 are similar to steps F102 to F112 shown in FIG. 18, and thus these steps will be described very briefly. In a state in which the hologram memory 3 is illuminated with the reproduction reference light L4B, second element holograms hL recorded in the second plane 3B of the hologram memory 3 are read. That is, in steps F202 to F206, data is read from second element holograms hL, the read data is decoded, and the resultant decoded data is stored in the nonvolatile memory 32.

If it is assumed that the hologram memory 3 is configured as shown in FIG. 14, the illumination of the hologram memory 3 with the reproduction reference light L4B allows it to read only element holograms hL on which the simplified-form data is recorded. Thus, the calculation of the data reading status in step F207 is performed for the simplified-form data in an early stage of the process.

In the following process, the processing flow is controlled so as to proceed in the order steps F208, F208, and F212 until 100% of the simplified-form data has been read. During this period, in step F212, the data reading status for the simplified-form data is indicated by displaying the data reading status bar 60 as shown in FIG. 17.

If reading of the simplified-form data is 100% completed, the process proceeds to step F210 from step F209. In this case, a message is displayed to indicate that reading of the simplified-form data is completed, and the indication by the data reading status bar 60 is switched so as to indicate the data reading status for the main data. More specifically, in step F210, the message is displayed to indicate that reading of the simplified-form data is completed, and the data reading status bar 60 is displayed so as to indicate that 0% of the main data has been read.

In the process after the completion of reading of the simplified-form data, the process proceeds to step F213 unless ending of the scanning operation is detected in step F211, and, in step F213, a determination is made as to whether the reproduction reference light L4A is being emitted.

When step F213 is performed for the first time, the operation state is in that the reproduction reference light L4B is being emitted, and thus in this case the process proceeds to step F214. In step F214, the system controller 51 controls the light source driver 14 to turn off the reference light source 16B and turn on the reference light source 16A. As a result, the reproduction reference light is switched to the reproduction reference light L4A which falls on the hologram memory 3 at the first angle θA. Thereafter, the process returns to step F202 and the above-described process is repeated from step F202. Thus, in the following process, the main data recorded on element holograms hH in the first plane 3A is read.

In step F211 in any iteration of the process, if it is determined that the scanning operation has been ended, then in step F216 the system controller 51 turns off the reproduction reference light L4A (or L4B). Thereafter, in step F217, the simplified-form data is reconstructed. If the reconstruction of the simplified-form data is completed, the process is ended.

In the case in which the scanning operation was continued until it was determined in step F208 that reading of the hologram memory 3 was completed, the system controller 51 turns off the reproduction reference light L4A in step F216 and reconstructs the main data in step F217. Thereafter, the process is ended.

When the process shown in FIG. 20 is performed to reproduce data recorded on the hologram memory 3 shown in FIG. 14, reading of the simplified-form data is completed in a short time after the scanning is started. When a user wants to acquire only the simplified-form data, the user may end the scanning operation at the point of time at which the reading of the simplified-form data is completed. Thus, when only the simplified-form data is needed, it is possible to complete the scanning operation in a very short time.

On the other hand, when the main data is needed, the scanning operation is continued until it is determined in step F208 that reading is completed. In this case, it is allowed to acquire high-quality data such as music data or a computer program.

That is, the user is allowed to perform the scanning operation in a different manner depending on what data the user wants to acquire, the situation, the preference of the user, etc., that is, for example, depending on whether to acquire low-quality data in a short time or acquire high-quality data even if a longer time is needed.

6. Advantages of Embodiments and Examples of Modifications to Embodiments

The embodiments of the invention described above provide the following advantages.

In the embodiments described above, the hologram memory 3 is configured such that the main data (the high-quality data) is recorded on the first element holograms, and the simplified-form data (such as low-quality data) representing the content of the main data by using a less data size than the data size of the main data is recorded on the second element holograms. Because the simplified-form data recorded on the second element holograms is small in data size, it is possible to easily read the entire simplified-form data in a short time. On the other hand, the main data recorded on the first element holograms is high in data quality. By recording both the main data and the simplified-form data having such properties, it becomes possible for a user to select data to be read depending on what data the user wants to acquire or depending on other factors. That is, when the user wants to acquire the main data even if reading of the main data needs a relative long time, the user can select the main data. On the other hand, when the data is not very important for the user, the user can select the simplified-form data which can be read in a short time.

The need for or the importance of the recorded information varies depending on users. The above-described capability, which allows users to arbitrary select data, makes it possible to realize a data download system capable of dealing with needs varying depending on users.

In the case where the simplified-form data is data which represents the same content as the content of the main data but which is lower in data quality than the main data, users can easily acquire the simplified-form data to evaluate or preview the main data before acquiring the main data. That is, the simplified-form data can be usefully used by users to evaluate or preview the main data before acquiring the main data.

The simplified-form data can be produced by compressing original data at a higher compression ratio than the compression ratio of the main data. This makes it possible to represent the content of the original data using a smaller data size than the data size of the main data.

The simplified-form data may be data obtained by extracting a part of the main data. For example, the simplified-form data may be data which is a part of music data or video content data. Such simplified-form data is useful for users to preview the content.

When the hologram memory 3 is configured such that the first element holograms and the second element holograms are recorded using the recording reference light L3 falling at the same angle, as with the examples shown in FIGS. 10 to 13, the hologram reader 6 is allowed to easily read both the main data and the simplified-form data. That is, the main data (recorded on the first element holograms) and the simplified-form data (recorded on the second element holograms) can be read in random order without having to switch the operation mode between the main data and the simplified-form data. Because there are a small number of second element holograms and they are disposed at positions that are highly likely to be scanned with a high probability, there is a high probability that reading of the simplified-form data is completed in a short time after the start of the scanning operation.

In the case in which the hologram memory 3 is configured using the angle multiplexing technique such that the first element holograms are recorded using the recording reference light L3A falling at the first angle θA, and the second element holograms are recorded using the recording reference light L3B falling at the second angle θB, it becomes possible to easily record the simplified-form data without causing a reduction in the storage capacity for the main data, and it becomes possible to ensure that the simplified-form data can be read from the second element holograms in a highly reliable fashion.

For example, as described above with reference to FIG. 20, the hologram reader 6 first turns on the reference light source 16B to read the simplified-form data and then switches the reference light source to the reference light source 16A to read the main data. This makes it possible to acquire the simplified-form data in an early stage of the scanning operation.

Because the simplified-form data is small in data size and the entire simplified-form data can be recorded using one or a small number of element holograms, it is allowed to form element holograms in the recording plane 3B in the angle multiplexed fashion such that the same data is recorded on many element holograms in a duplicated fashion. This makes it possible to achieve a great increase in the reading probability for the simplified-form data. That is, it becomes possible to read the simplified-form data very quickly.

In the embodiments described above, the hologram reader 6 reads the second element holograms, decodes the read data, and stores the decoded data into the nonvolatile memory 32. When as much decoded data as sufficient to reproduce the simplified-form data has been collected in the nonvolatile memory 32, the simplified-form data is reproduced by reconstructing the decoded data. Similarly, the main data is reproduced such that data read from the first element holograms is decoded and stored in the nonvolatile memory 32, and, when as much decoded data as sufficient to reproduce the main data has been collected in the nonvolatile memory 32, main data such as audio content data or the like is reproduced by reconstructing the decoded data. This means that it is allowed to read the first or second element holograms on the hologram memory 3 in random order. This is very advantageous in particular to realize a system in which element holograms are scanned in random order by a manual scanning process as described above with reference to FIG. 7 or 8. This technique is also useful even in a system in which the varying scan position is controlled by the camera control mechanism 13, because the technique allows the camera control mechanism 13 to have a great degree of freedom in its operation.

When as much decoded data as sufficient to reproduce the simplified-form data has been collected in the nonvolatile memory 32, a message is displayed on the display 52 to notify a user that it becomes ready to reproduce the simplified-form data by reconstructing the decoded data.

When the user wants to acquire only the simplified-form data, the user can end the manual scanning operation when the message is displayed. This provides high usability to users. Besides, when the user wants to acquire only the simplified-form data, it is possible to prevent the user from continuing the useless scanning operation to read the unnecessary main data.

As a matter of course, when the user wants to acquire main data, the user may continue the scanning operation while monitoring the data reading status. Displaying of the data reading status allows the user to know whether the operation is correctly proceeding and thus allows the user not to have feeling of insecurity as to the progress of the operation.

At the point of time at which the data reading status indicates that as much decoded data as sufficient to reproduce the main data has been collected in the nonvolatile memory 32, the user is allowed to reproduce only the main data. This provides high efficiency in the process. Note that in the case in which the user has continued the scanning operation until as much decoded data as necessary to reproduce the main data has been collected, the intention of the user is to acquire the main data, and the simplified-form data is generally not needed. When this is the case, the decoded data associated with simplified-form data may be discarded.

As described above, a wide variety of data is allowed to be recorded as simplified-form data. In some cases, the simplified-form data may include auxiliary or additional information. In another case, reproduction information associated with main data is obtained by combining the main data and simplified-form data. In such a case, it is desirable that all or a part of the information associated with the simplified-form data be stored as reproduction information.

In the present embodiment, the geometrical correction variables and the optical correction variables are calculated from the two-dimensional image stored in the information memory 31, and the calculated correction variables are stored in the variable memory 26. When the binarization unit 24 performs the binarization, the binarization is performed using the correction variables stored in the variable memory 26 thereby reproducing the information in the form in which the geometrical distortion correction and the optical correction have been made. In this scheme, the two-dimensional image stored in the information memory 31 is not directly subjected to the geometrical distortion correction and the optical correction, and thus writing of corrected two-dimensional image into the information memory 31 does not occur. Therefore, it is possible to prevent an increase in the processing burden and the processing time associated with accessing to the information memory 31 which will occur if the geometric distortion correction and the optical distortion correction are performed. Thus, it is possible to perform the reproduction process in a highly efficient manner.

Not performing the correction process on the two-dimensional image until the binarization is performed also provides an advantage that calculation errors in the correction process can be suppressed.

Figure 21:
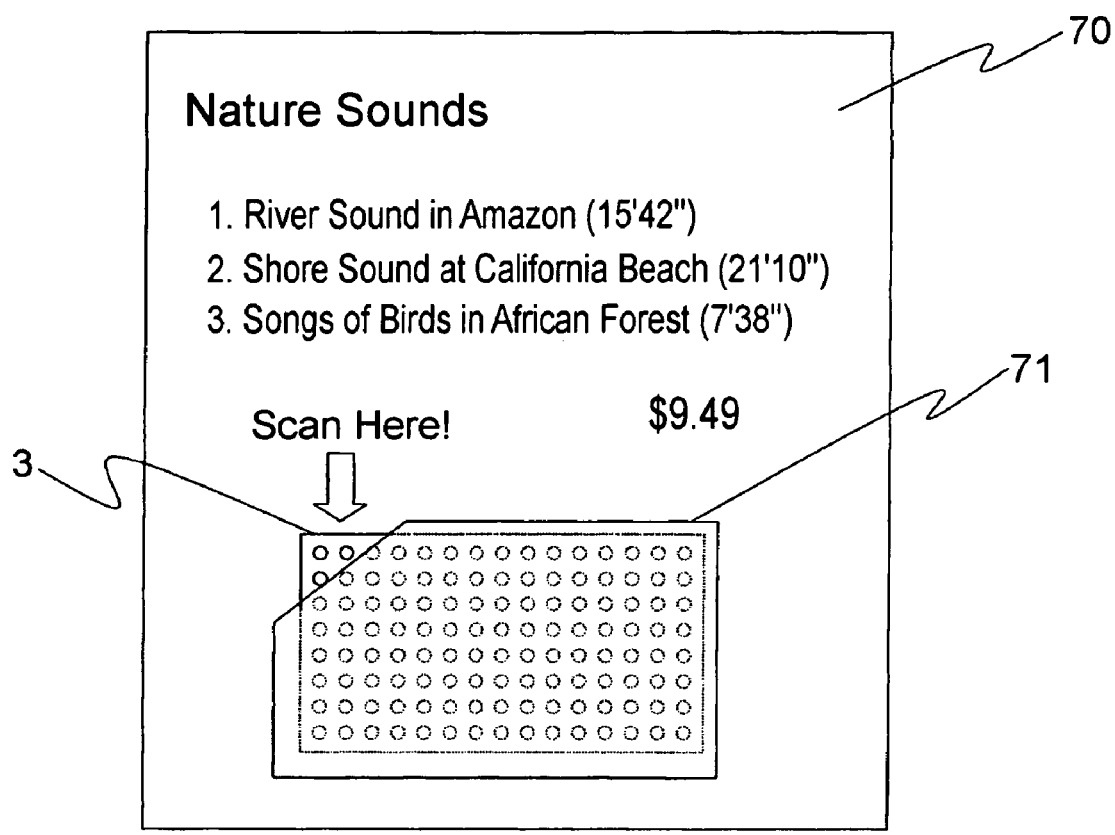
FIG. 21 is a schematic diagram showing a hologram memory according to an embodiment of the present invention.

FIG. 21 shows an example of a package for use in selling a hologram recording medium according to one of the embodiments of the present invention. In this example, the hologram recording medium 3 is in the form of a sheet, and audio data whose titles are printed on a mount 70 is recorded on the hologram recording medium 3. In this specific example, three tracks of data are recorded on the hologram recording medium 3.

More specifically, three tracks of audio data, that is, 1. River Sound in Amazon, 2. Shore Sound at California Beach, and 3. Songs of Birds in African Forest, are converted into hologram data and recorded on the hologram recording medium 3.

A mask 71 in the form of a sheet is provided to mask the hologram recording medium 3 such that only a part of the hologram recording medium 3 is exposed and the other part is masked. After a user purchased the hologram recording medium 3, the mask 71 can be peeled by the user from the mount 70. By peeling the mask 71 from the mount 70, it becomes possible to scan element holograms formed on the hologram recording medium 3 over the entire area of the hologram recording medium 3 by using the reproducing apparatus 6.

When a user of the reproducing apparatus 6 wants to listen to the audio content before deciding whether to purchase it, the user scans, using the reproducing apparatus 6, the hologram recording medium 3 which is placed together with the mask 71 on the mount 70 such that a part of the hologram data is exposed via the mask 71. In the specific example shown in FIG. 21, a part indicated by a printed character string "Scan Here!" is allowed to be scanned.

In this hologram recording medium 3, digests each of which is a part of corresponding one of three tacks of audio data whose titles are printed on the mount 70 are recorded in the area uncovered by the mask 71 so that users can listen to the digests.

That is, by scanning using the reproducing apparatus 6 this area of the hologram recording medium 3 in which the audio data of the digest version is recorded and which is exposed without being covered by the mask 71, the user of the reproducing apparatus 6 can read the digest of the audio data into the reproducing apparatus 6 and can listen to the digest of the audio data recorded on the hologram recording medium 3.

Thus, the user of the reproducing apparatus 6 can evaluate the audio content recorded on the hologram recording medium 3 and can decide whether to purchase it.

After the user purchased the package including the hologram recording medium 3, if the user peels the mask 71, it becomes possible to scan the entire area of the hologram recording medium 3 by using the reproducing apparatus 6 thereby making it possible to reproduce the entire content of each track recorded on the hologram recording medium 3.

In the above example, the mask 71 is used to cover the hologram recording medium 3 such that a part thereof is exposed. Alternatively, the mount 71 may be partially cut, and the hologram recording medium 3 may be placed on the mount 71 such that the area in which the digests of audio content data is exposed on the back surface of the mount 70 via the cut. This makes the mask unnecessary.

The digest data may be provided not for all tracks of audio data but for only one or more tracks. The data for evaluation does not necessarily need to be a part of entire audio data but the data for evaluation may be data subjected to a sound quality reduction process. An example of a sound quality reduction process is a noise inclusion process. Another example is to mix the original audio data with speech data about the content of the audio data. Still another example is to convert multichannel audio data such as two-channel audio data into monophonic audio data.

The hologram recording medium 3 may be formed as a part of the mount 70, that is, the mount 70 may be a hologram recording sheet. For example, character strings such as "Nature Sounds" or "Scan Here!" printed on the mount 70 shown in FIG. 21 or pictures visual by human users may also be provided in the form of a hologram visually perceivable by human users, and the content data may be recorded in the form of element holograms on the mount 70. In this case, data for evaluation may be recorded in an exposed form on the mount 70, while the element holograms on which content data is recorded may be covered with the mask 71 so that only the data for evaluation is allowed to be scanned by using the reproducing apparatus 6.

The mount 70 may be formed as a hologram recording sheet such that character strings such as "Nature Sounds" or "Scan Here!" printed on the mount 70 in the example shown in FIG. 21 or pictures visual by human users are provided on the mount 70 in the form of a hologram visually perceivable by human users, data for evaluation of content is printed on the mount 70, and element holograms on which the content data is recorded are printed on a surface, facing the mount 70, of the mask 71.

The form of the mask 71 is not limited to a sheet form, but the mask 71 may be formed by coating a material on a part of the hologram recording sheet such that the coating can be removed by scratching using a coin or the like as with a scratch card.

The present invention has been described above with reference to specific embodiments. Note that the configuration and the operation of the hologram memory 3 and the hologram reader 6 are shown by way of example but not limitation. Various modifications can be possible without departing from the scope of the present invention.

The main data and the simplified-form data recorded on the hologram memory 3 are not limited to the examples shown in the embodiments, but a wide variety of other main data and simplified-form data may be recorded.

The positions at which the first element holograms for the main data are formed and the positions at which the second element holograms for the simplified-form data are not limited to the examples described above.

In the angle-multiplexed recording, the first element holograms are formed in one recording plane (the first plane 3A) and the second element holograms are formed in the other recording plane (the second plane 3B) as shown in FIG. 14. Alternatively, the first and second element holograms hH and hL may be formed in both recording planes in a mixed fashion.

In the angle-multiplexed recording, data may be recorded in a greater number of recording planes by illuminating the hologram memory 3 by reference light at a greater number of different angles. In this case, the hologram reader 6 is modified such that the reproduction reference light can be emitted at a corresponding number of different angles.

In the hologram reader 6, when reading of the simplified-form data is completed, a message is displayed on the display 52 to notify a user of the completion of the reading of the simplified-form data. Alternatively, a voice/sound notification using a voice synthesizer and a speaker may be provided in addition to the notification displayed on the display 52 or without providing the notification displayed on the display 52.

For example, when step F110 shown in FIG. 18 or step F211 shown in FIG. 20 is performed for the first time, a voice message may be output to inform a user that reading of the simplified-form data is completed. This allows the user to more easily detect the correct timing of ending the scanning operation when only the simplified-form data is needed. Alternatively, when a text message is displayed on the display 52, a sound/voice such as an electronic sound, a melody sound, or a sound effect may also be output to call a user's attention. This makes it possible for the user to further easily to detect the correct timing of ending the scanning operation.

In the embodiments described above, the data reading status is displayed during the manual scanning operation. Instead of displaying the data reading status bar 70 shown in FIG. 17, the data reading status may be indicated by displaying a circle or the like or may be indicated by displaying only a numeric value indicating the percentage of the completed process. Instead of using the liquid crystal display, a plurality of LEDs may be provided and the data reading status may be indicated by turning on a particular number of LEDs or a LED located at a particular position.

The data reading status for the main data and the data reading status for the simplified-form data may both be displayed in a parallel fashion.

In addition to or instead of the display 52 disposed on the main body of the hologram reader 6, the data reading status may be displayed on an external display connected to the hologram reader 6 via the external device interface 41.

A voice message may be output to inform a user of the data reading status. For example, a voice message such as "25% of the reading process is completed" or "50% of the reading process is completed" may be output depending on the data reading status.

A large number of copies of the hologram memory 3 according to any one of the embodiments described above may be easily produced.

For example, computer data, audio visual data, or the like may be recorded on a hologram recording medium, a large number of copies thereof may be produced, and they may be distributed among a large number of users so that users are allowed to acquire the data recorded on the hologram memory 3 by reading the data using a reproducing apparatus (the hologram reader 6).

In the embodiments of present invention, as described above, the main data and the simplified-form data representing the content of the main data by using a less data size than the data size of the main data are both recorded on the hologram recording medium. Because the simplified-form data recorded on the second element holograms is small in data size, it is possible to easily read the entire simplified-form data in a short time. On the other hand, the main data recorded on the first element holograms is high in data quality. By recording both the main data and the simplified-form data having such properties, it becomes possible for a user to select data to be read depending on what data the user wants to acquire or depending on other factors. That is, when the user wants to acquire the main data, the user can read the main data. On the other hand, when the data is not very important for the user, the user can read the simplified-form data in a short time.

It should be understood by those skilled in the art that various modifications, combinations, sub-combinations and alterations may occur depending on design requirements and other factors insofar as they are within the scope of the appended claims or the equivalents thereof.

What is claimed is:

1. A hologram recording medium adapted to record data thereon as a plurality of element holograms such that data recorded on each one of the plurality of element holograms is an image of two-dimensional page data, object light of the image of the two-dimensional page data is interfered with recording reference light, and an interference fringe produced as a result of the interference is recorded as a respective one of the plurality of element holograms on the hologram recording medium, the hologram recording medium comprising:
    a first element hologram of the plurality of element holograms on which subject data is recorded such that the subject data is a first image of first two-dimensional page data, object light of the first image of the first two-dimensional page data is interfered with recording reference light, and an interference fringe produced as a result of the interference is recorded on the first element hologram; and
    a second element hologram of the plurality of element holograms on which abridged subject data is recorded such that the abridged subject data is a second image of second two-dimensional page data, object light of the second image of the second two-dimensional page data is interfered with recording reference light, and an interference fringe produced as a result of the interference is recorded on the second element hologram, wherein
    the abridged subject data includes a representative sample of the subject data,
    the abridged subject data has a total data size that is smaller than a total data size of the subject data, and
    the bridged subject data is completely read out in a shorter time than the subject data.

2. The hologram recording medium according to claim 1, wherein the abridged subject data is data with lower data quality than the data quality of the main data.

3. The hologram recording medium according to claim 1, wherein the abridged subject data is data compressed at a higher compression ratio than a compression ratio of the main data.

4. The hologram recording medium according to claim 1, wherein the abridged subject data is data obtained by extracting a part of the main data.

5. The hologram recording medium according to claim 1, wherein the first element hologram and the second element hologram are recorded using recording reference light with the same incident angle.

6. The hologram recording medium according to claim 1, wherein the first element hologram is recorded using recording reference light falling on the hologram recording medium at a first angle, and the second element hologram is recorded using recording reference light falling on the hologram recording medium at a second angle.

7. A hologram reproducing apparatus adapted to reproduce data from a hologram recording medium, the data being recorded on the hologram recording medium as a plurality of element holograms such that data recorded on each of the plurality of element holograms is an image of two-dimensional page data, object light of the image of the two-dimensional page data is interfered with recording reference light, an interference fringe produced as a result of the interference is recorded as a respective one of the plurality of element holograms on the hologram recording medium, comprising:
    an imaging mechanism configured to take an image by illuminating the hologram recording medium with reproduction reference light and take an image of two-dimensional page data which is optically reproduced as image light from an element hologram of the plurality of element holograms as a result of the illumination of the hologram recording medium with reproduction reference light;
    a signal processor configured to perform signal processing on the image of the two-dimensional page data obtained by the imaging mechanism to decode the two-dimensional page data recorded as the element hologram; and
    a reproducing mechanism configured to reproduce, in accordance with classification information, a subject data from the data decoded from the two-dimensional page data recorded on a first element hologram of the plurality of element holograms or reproduce an abridged subject data from the data decoded from the two-dimensional page data recorded on a second element hologram of the plurality of element holograms, wherein
    the abridged subject data includes a representative sample of the subject data,
    the abridged subject data has a total data size that is smaller than a total data size of the subject data, and
    the abridged subject data is completely read out in a shorter time than the subject data.

8. The hologram reproducing apparatus according to claim 7, further comprising a storage mechanism,
    wherein the signal processor stores decoded data acquired from respective element holograms into the storage mechanism, and, after as much decoded data as sufficient to reproduce the abridged subject data has been collected in the storage mechanism, the signal processor constructs the abridged subject data by reconstructing the decoded data collected in the storage mechanism.

9. The hologram reproducing apparatus according to claim 8, further comprising a notification mechanism configured to, when as much decoded data as sufficient to reproduce the abridged subject data has been collected in the storage mechanism, notify that it has become ready to reproduce the abridged subject data by reconstructing the decoded data.

10. The hologram reproducing apparatus according to claim 7, further comprising a storage device,
the signal processor stores decoded data acquired from respective element holograms into the storage device, and, when as much decoded data as sufficient to reproduce the subject data has been collected in the storage device, the signal processor constructs only the subject data by constructing the decoded data collected in the storage device.

11. The hologram reproducing apparatus according to claim 7, wherein the imaging mechanism is adapted to perform a first operation and a second operation, the first operation including illuminating the hologram recording medium with reproduction reference light with a first illumination angle and taking a first image of a first two-dimensional page data of an element hologram recorded using recording reference light with the first illumination angle, the second operation including illuminating the hologram recording medium with reproduction reference light with a second illumination angle and taking a second image of a second two-dimensional page data of an element hologram recorded using recording reference light with the second illumination angle.

12. A method of reproducing data from a hologram recording medium adapted to record data thereon as a plurality of element holograms such that data recorded on each one of the plurality of element holograms is an image of two-dimensional page data, object light of the image of the two-dimensional page data is interfered with recording reference light, and an interference fringe produced as a result of the interference is recorded as a respective one of the plurality of element holograms on the hologram recording medium, the method comprising the steps of:
taking an image by illuminating the hologram recording medium with reproduction reference light and taking an image of two-dimensional page data which is optically reproduced as image light from an element hologram of the plurality of element holograms as a result of the illumination of the hologram recording medium with reproduction reference light;
performing signal processing on the image of the two-dimensional page data obtained in the image taking step to decode the two-dimensional page data recorded as the element hologram;
classifying the decoded data on the basis of classification data that classifies whether the decoded data is subject data or abridged subject data; and
in accordance with the classification data, reproducing the subject data from the data decoded from the two-dimensional page data recorded on a first element hologram of the plurality of element holograms or reconstructing the abridged subject data from the data decoded from the two-dimensional page data recorded on a second element hologram of the plurality of element holograms, wherein
the abridged subject data includes a representative sample of the subject data,
the abridged subject data has a total data size that is smaller than a total data size of the subject data, and
the abridged subject data is completely read out in a shorter time than the subject data.

13. A hologram sheet on which data is recorded, comprising:
a first hologram recording area in which data is recorded as a first plurality of element holograms such that the data is divided into a first plurality of data blocks each having a predetermined data size, each of the first plurality of data blocks is an image of two-dimensional page data, object light of the image of the two-dimensional page data is interfered with recording reference light, and an interference fringe produces as a result of the interference is recorded as a respective one of the first plurality of element holograms; and
a second hologram recording area in which information which is related to the data recorded in the first hologram recording area is recorded as a second plurality of element holograms such that the data of the information is divided into a second plurality of data blocks each having a predetermined data size, each of the second plurality of data blocks of the information is an image of two-dimensional page data, object light of the image of the two-dimensional page data is interfered with recording reference light, and an interference fringe produces as a result of the interference is recorded as a respective one of the second plurality of element holograms;
wherein the hologram sheet is partially masked such that only the second hologram recording area is exposed, and
wherein the information recorded on the second hologram area is a representative sample of the data recorded on the first hologram area.

14. The hologram sheet according to claim 13, wherein the hologram sheet is partially masked with a mask material such that the mask material can be peeled from the hologram sheet.

15. A hologram sheet according to claim 13, wherein the hologram sheet is removably attached to a mount such that the second hologram recording area is exposed via a cut formed in the mount and such that the first hologram recording area is exposed when the hologram sheet is removed from the mount.

16. A hologram sheet according to claim 13, wherein information visible by a human eye is recorded in a predetermined area of the hologram sheet.

17. A hologram sheet according to claim 13, wherein a digest produced by extracting data with a data size corresponding to a predetermined time period for playback of the data recorded in the first hologram recording area is recorded in the second hologram recording area.

18. A hologram sheet according to claim 13, wherein data produced by compressing information of the data recorded in the first hologram recording area is recorded in the second hologram recording area.

19. A hologram reproducing apparatus adapted to reproduce data from a hologram recording medium, the data being recorded on the hologram recording medium as a plurality of element holograms such that data recorded on each one of the plurality of element holograms is an image of two-dimensional page data, object light of the image of the two-dimensional page data is interfered with recording reference light, an interference fringe produced as a result of the interference is recorded as a respective one of the plurality of element holograms on the hologram recording medium, comprising:
an imaging unit configured to take an image by illuminating the hologram recording medium with reproduction reference light and take an image of two-dimensional page data which is as reproduced as image light from an element hologram of the plurality of element holograms as a result of the illumination of the hologram recording medium with reproduction reference light;

a signal processing unit configured to perform signal processing on the image of the two-dimensional page data obtained by the imaging unit to decode the two-dimensional page data recorded as the element hologram; and means for reproducing, in accordance with classification information, a subject data from the two-dimensional page data decoded from the data recorded on a first element hologram of the plurality of element holograms or an abridged subject data from the data decoded from the two-dimensional page data recorded on a second element hologram of the plurality of element holograms, wherein the abridged subject data includes a representative sample of the subject data, the abridged subject data has a total data size that is smaller than a total data size of the subject data, and the abridged subject data is completely read out in a shorter time than the subject data.

* * * * *